(12) United States Patent
Turudic

(10) Patent No.: US 9,909,720 B1
(45) Date of Patent: Mar. 6, 2018

(54) 2-D LAMP WITH INTEGRATED THERMAL MANAGEMENT AND NEAR-IDEAL LIGHT PATTERN

(71) Applicant: Andy Turudic, Hilliboro, OR (US)

(72) Inventor: Andy Turudic, Hilliboro, OR (US)

(73) Assignee: Andy Turudic, Hillboro, OR (US)

( * ) Notice: Subject to any disclaimer, the term of this patent is extended or adjusted under 35 U.S.C. 154(b) by 0 days.

(21) Appl. No.: 15/394,360

(22) Filed: Dec. 29, 2016

Related U.S. Application Data

(63) Continuation of application No. 14/846,665, filed on Sep. 4, 2015, now Pat. No. 9,534,773.

(60) Provisional application No. 62/045,560, filed on Sep. 4, 2014.

(51) Int. Cl.
| | |
|---|---|
| *H02H 3/08* | (2006.01) |
| *H02H 3/087* | (2006.01) |
| *H02H 9/02* | (2006.01) |
| *F21K 9/238* | (2016.01) |
| *F21V 5/04* | (2006.01) |
| *F21V 29/70* | (2015.01) |
| *F21V 23/00* | (2015.01) |
| *F21K 9/232* | (2016.01) |
| *F21K 9/237* | (2016.01) |
| *F21V 9/16* | (2006.01) |
| *H05B 33/08* | (2006.01) |
| *F21V 7/06* | (2006.01) |
| *F21K 9/235* | (2016.01) |
| *F21K 9/233* | (2016.01) |
| *F21Y 115/10* | (2016.01) |

(52) U.S. Cl.
CPC .............. *F21K 9/238* (2016.08); *F21K 9/232* (2016.08); *F21K 9/233* (2016.08); *F21K 9/235* (2016.08); *F21K 9/237* (2016.08); *F21V 5/04* (2013.01); *F21V 7/06* (2013.01); *F21V 9/16* (2013.01); *F21V 23/005* (2013.01); *F21V 29/70* (2015.01); *H05B 33/089* (2013.01); *H05B 33/0815* (2013.01); *F21Y 2115/10* (2016.08)

(58) Field of Classification Search
CPC ................................. H02H 3/08; H02H 3/087
USPC ....................................................... 361/93.1
See application file for complete search history.

(56) References Cited

U.S. PATENT DOCUMENTS

| | | | |
|---|---|---|---|
| 2010/0314655 A1* | 12/2010 | Thompson ................ | F21K 9/00 257/99 |
| 2011/0255280 A1* | 10/2011 | Chen ........................ | F21L 14/00 362/235 |
| 2011/0304270 A1* | 12/2011 | Scarpelli ................. | F21V 5/007 315/113 |
| 2013/0286666 A1* | 10/2013 | Bakk ......................... | F04F 7/00 362/363 |
| 2013/0322019 A1* | 12/2013 | Gasse ................. | H01L 21/4882 361/709 |
| 2014/0091697 A1* | 4/2014 | Shum ....................... | F21V 5/04 313/46 |

(Continued)

*Primary Examiner* — Dharti Patel
(74) *Attorney, Agent, or Firm* — Womble Bond Dickinson (US) LLP

(57) ABSTRACT

A lamp is provided. The lamp includes at least one light emitting diode (LED) and an electronic circuit configured to provide power to the at least one LED. The lamp includes at least one flat circuit board having mounted thereto the at least one LED and the electronic circuit. The at least one flat circuit board acts as a heatsink to dissipate heat from the at least one LED and acts as a plurality of circuit paths for the electronic circuit and the at least one LED.

19 Claims, 20 Drawing Sheets

(56) References Cited

U.S. PATENT DOCUMENTS

| | | | |
|---|---|---|---|
| 2015/0167950 A1* | 6/2015 | Payne | H01H 37/761 361/104 |
| 2015/0201486 A1* | 7/2015 | Voelker | H05K 7/2039 361/709 |
| 2015/0311402 A1* | 10/2015 | van de Ven | H01L 33/44 257/98 |

* cited by examiner

2-D LAMP WITH INTEGRATED THERMAL MANAGEMENT AND NEAR-IDEAL LIGHT PATTERN

BACKGROUND

The availability of the white LED (light emitting diode) die in high power versions, e.g., 1 watt (W) or more electrical power, has enabled the production of lamps with several hundred to several thousand lumens (lm) of light output. The 60 W incandescent bulb produces approximately 800 lumens of output, so a 110 lumen per watt plurality of white 1 watt LEDs would need 850/110 or 8 LEDs, with 8 watts of power (1 watt per LED) producing 880 lumens of light output at the emitter (LED). Due to lightpath losses, typically 90% of that light is useful, resulting in approximately 800 lumens of net light output in the instant example.

Since the LED is a planar light source in the near field, it cannot produce an omnidirectional cylindrical light output in the near field like a suspended filament can, typically producing a Lambertian beam pattern with a half power inscribed beam angle of 120 degrees, possibly assisted by an integrated silicone dome, though the beam angle can be varied by the LED component manufacturer by design.

So, to emulate a piece of suspended wire, heated by an electrical current, the first consideration of sufficient light output is addressed by using 8 LEDs in the instant example. Those eight LEDs, in this example, each only produce a fractional portion of the cylinder or sphere of light produced by the filament, so they could be arranged to produce a similar light pattern to the incandescent. Then, being a two port device, a diode, each LED must have two electrical connections made to it. Each LED has a forward voltage of about 3V (volts) per LED, so placing them in series means about 24V DC (direct current) of forward voltage on the "array". In one embodiment, the line voltage is nominally 120V AC (alternating current) RMS (root mean square)+/−10%, so it can be as high as 132V RMS, or 187V peak. So a plurality of DC LEDs needs some means of changing AC to DC, as well as lowering the voltage to the nominal 24 VDC or so. The sensitivity of light output to voltage on LEDs is very high, so they are typically controlled by the lower sensitivity current through them, resulting, in the instant example, in 24 VDC or so across the 8 LEDs.

A power conversion apparatus is typically used to convert the 120 VAC RMS line voltage into current through the LEDs. The mathematical product of forward voltage and current for an LED is the power applied to the device. Of that power, about 80% is produced as heat and 20% as light. A power conversion block may be about 80% efficient, so thermal power that must be removed, and dumped into the ambient air by means of natural or forced convection, after conducting the heat away from the high density heat flux at the devices is going to be about 8.4 watts. If we factor in the power conversion block, and because of the power converter losses, 10 W of line power must be delivered to the power converter in order for it to deliver 8 W of electrical power to the LEDs in the instant example. The device, known as a 'heatsink", for moving ("sinking") the heat away from each individual LED by thermal conduction and providing the surface area for convection cooling is, in LED lamps' prior art, typically comprised of relatively thick, diecast, aluminum and is typically designed to maximize material cross-section to enhance the thermal conduction process and in many instances is finned to increase the surface area of the device to enhance convective/radiative heat transfer from the heatsink to ambient air (the "sink"). An aluminum circuit board core ("MPCB") may be attached to the heatsink, where the MPCB forms an electrically interconnected sub-assembly. Some implementations actually use an air-mover (fan, as an example) to enhance the convection portion of the heat transfer process. The entire configuration, with all these considerations, is designed to more or less fit into the ANSI A19 specification light bulb envelope using North America as an example, in the case of the 60 W standard service light bulb. Known prior art implements three dimensional, rotations of a profile in cylindrical coordinates, and few, if any are known to be the point sources of light that distribute light evenly in all directions to result in the same light flux on a spherical surface a constant distance from that point (or, short, line) source location specified by ANSI's A19 specification. A line source may also be used instead of a point source where there is a linear arrangement of a plurality of interconnected LEDs, which will result in a cylindrical distribution of light in the near field. To further complicate matters, this standard service A19 lamp is used horizontally, usually in pairs, in ceiling fixtures where half the emitted light goes upwards to the ceiling and a near-perfect reflector is rarely used to reflect the light out of the fixture down into the room. These fixtures are usually fully enclosed, so in the case of the incandescent, 120 W of heat source is fully enclosed within the fixture, with a very poor thermal conductivity glass cover providing optical transmission and a degree of dustproofing. Some implementations of LED lamps are as shown in the following figures.

FIG. 1 is a view of a Mirabella™ compact fluorescent lamp (CFL). FIG. 2 is a view of a Cree™ LED A19 beside an incandescent A19. FIG. 3 is a view of the interior of the Cree™ bulb showing the LED arrangement on an aluminum carrier attached to a heatsink, and the use of a connector "clip" which then attaches via a connector to the driver circuit board. FIG. 4 is a further view of the interior of the Cree™ bulb. FIG. 5 is a view of an EcoSmart™ bulb showing an alumina LED board mounted in an aluminum heatsink, with external wiring going down inside to the driver board housed inside the heatsink/base. FIG. 6 is a view of a Best Buy™ 60 W bulb, which has three aluminum heatsinks to which aluminum substrates are screwed, then these are wired into the base where the driver circuit boards are. A translucent plastic shell is used between the aluminum heatsink "petals", and such shells are typically attached with an adhesive. FIG. 7 is a further view of the Best Buy™ 60 W bulb, showing its interior. FIG. 8 is a view of an LG™ "snocone", which uses a similar design as the EcoSmart™ bulb. FIG. 9 is a view of an LED bulb from TESS Corp., which has multiple intense LED sources, two of these output 429 lumens at 8.6 W. FIG. 10 is a view of a Maxxima™ LED bulb. FIG. 11 is a view of a Phillips™ LED bulb, from blog.makezine.com. The aluminum core LED carrier board has a connector, which screws to the large heatsink. Also shown are a white plastic reflector and a remote phosphor (yellow) plastic cover. FIG. 12 shows the circuit board of FIG. 10, with a driver, which slides inside the aluminum heatsink and connect via soldered wire to the screw caps and connectors to the LED sectors.

Significant costs are incurred in conventional LED lamp designs, as can be seen in the examples, by the use of large die-cast aluminum heat sinks (16%), labor and assembly, connectors, clips, screw base, and hand soldering of the screw base and wires between the driver board and the LED aluminum core circuit board (18%). Lifetime claims of tens of thousands of hours are contraindicated by the extensive use of connectors and hand soldered joints that can and will fail especially during such conditions as temperature cycling or extended high temperature operation and of voiding within thermal compounds between aluminum core boards and the main aluminum heat sink. See for example, FIG. 13, which is a cutaway view of a 3M™ LED bulb.

The nature of design practice among those versed in the art is, as shown in the above examples, to use a screw base, a cast aluminum heat sink, a driver circuit board or boards made of material such as FR1, CEM-3, or FR-4, connectors or solder joints to an aluminum-core circuit board sub assembly, which is then mechanically attached using thermal compounds and fasteners to the aluminum heat sink. A plastic shell is used for such purposes as to diffuse light, convert blue light to white light, to protect components within the shell, to preclude a shock hazard, or in 3M's case guide light, with the light originating from the individual LED sources in a singular or plurality of arranged LEDs, with every design shown above exhibiting a compromise to ideally having an omnidirectional point light source, or short vertical line source, as required in both the ANSI A19 specifications and as inherent in incandescent light bulb designs. All LED lighting (as shown above) that attempts to replace A19 light bulbs adheres to a geometric rotation of one or more silhouettes in a cylindrical coordinate system about a vertical centerline and all attempt to arrange the LEDs in a compromise between such things as optical, thermal, reliability, manufacturing, safety, and electrical considerations. All attempt to couple as much of the LEDs' heat to the large diecast heat sink for exchanging the heat to ambient air via convection, conduction, and radiation. Electrical connections shown above are always made using a metal "Edison screw" cap in the instance of a North American A19 bulb, though other means such as a bayonet or other means of termination are not precluded.

Some of the resulting light patterns from various A19 replacement designs are shown here. FIG. 14 is a light pattern for an A19 replacement LED bulb by Cree™. FIG. 15 is a light pattern for an A19 replacement LED "Lighting Science" bulb by EcoSmart™. FIG. 16 is a light pattern for an A19 replacement LED Maxxima "snocone" style bulb. FIG. 17 is a light pattern for an A19 replacement compact fluorescent lamp by Mirabella.

Therefore, there is a need in the art for a solution which overcomes the drawbacks described above.

SUMMARY

In some embodiments, a lamp is provided. The lamp includes at least one light emitting diode (LED) and an electronic circuit configured to provide power to the at least one LED. The lamp includes at least one flat circuit board having mounted thereto at least one LED and the electronic circuit. The at least one flat circuit board, or an arrangement of flat circuit boards, eliminates a heatsink casting or assembly and acts as a heatsink to conduct and dissipate heat away from at least one LED and acts as a plurality of circuit paths for the electronic circuit and the at least one LED.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
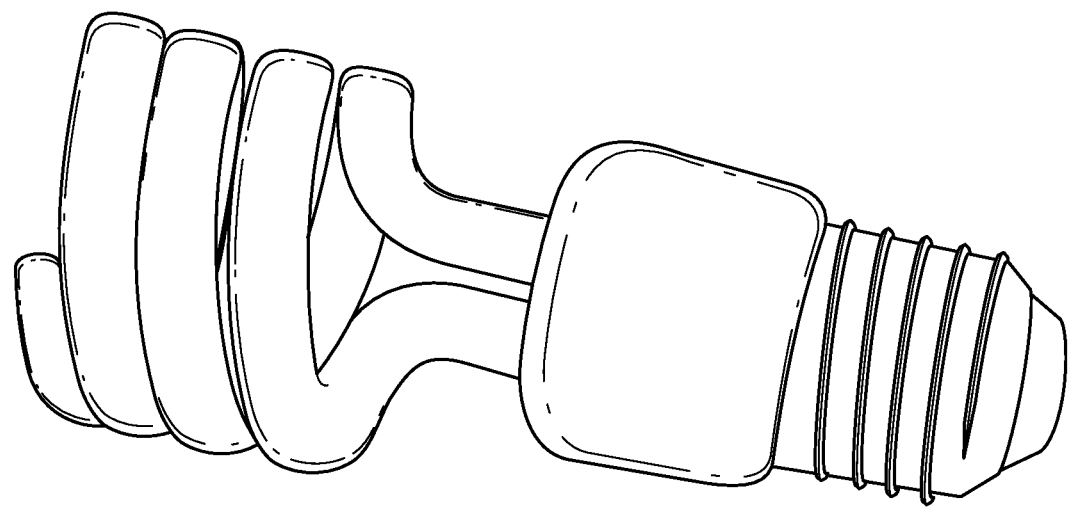
FIG. 1 is a view of a Mirabella™ compact fluorescent lamp (CFL).
Figure 2:
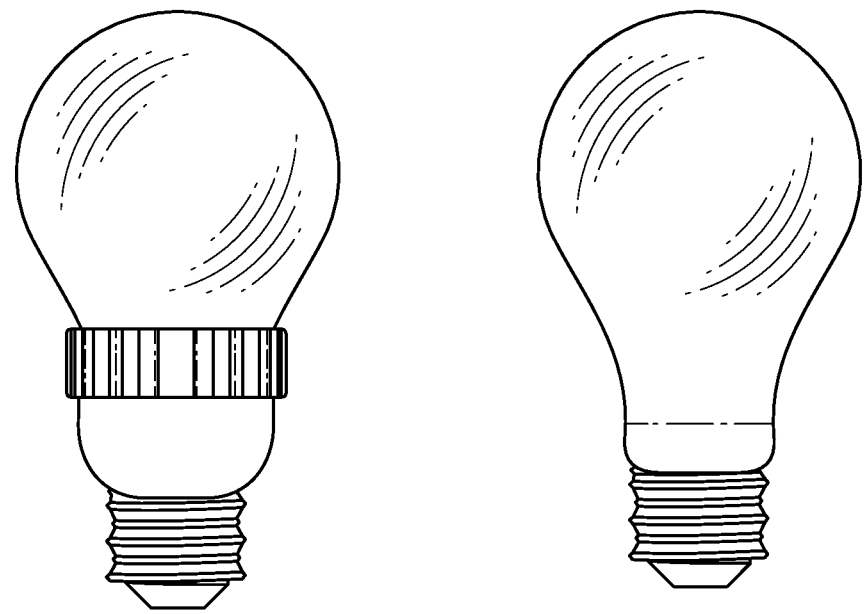
FIG. 2 is a view of a Cree™ LED A19 beside an incandescent A19.
Figure 3:
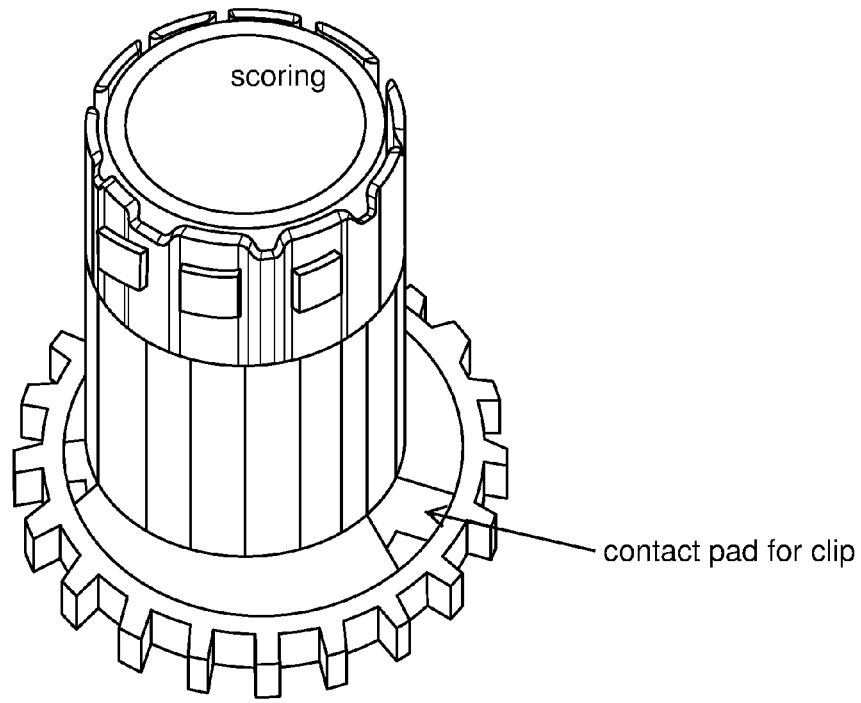
FIG. 3 is a view of the interior of the Cree™ bulb showing the LED arrangement on an aluminum carrier attached to a heatsink, and the use of a connector "clip" which then attaches via a connector to the driver circuit board.
Figure 4:
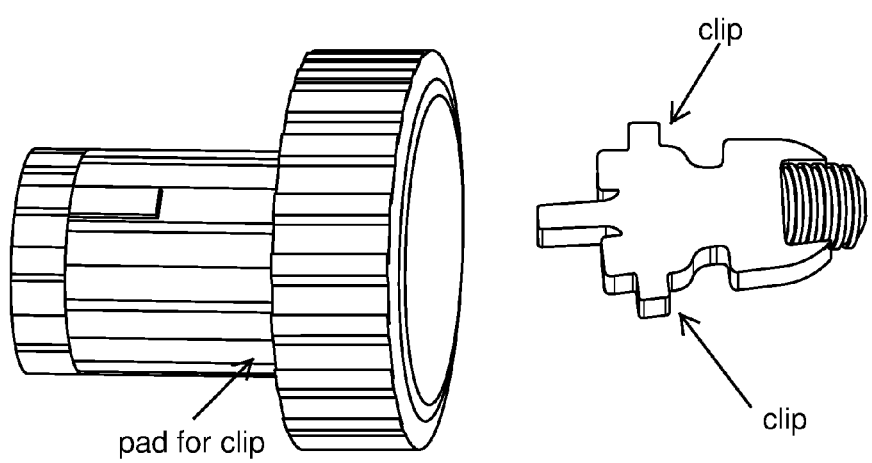
FIG. 4 is a further view of the interior of the Cree™ bulb.
Figure 5:
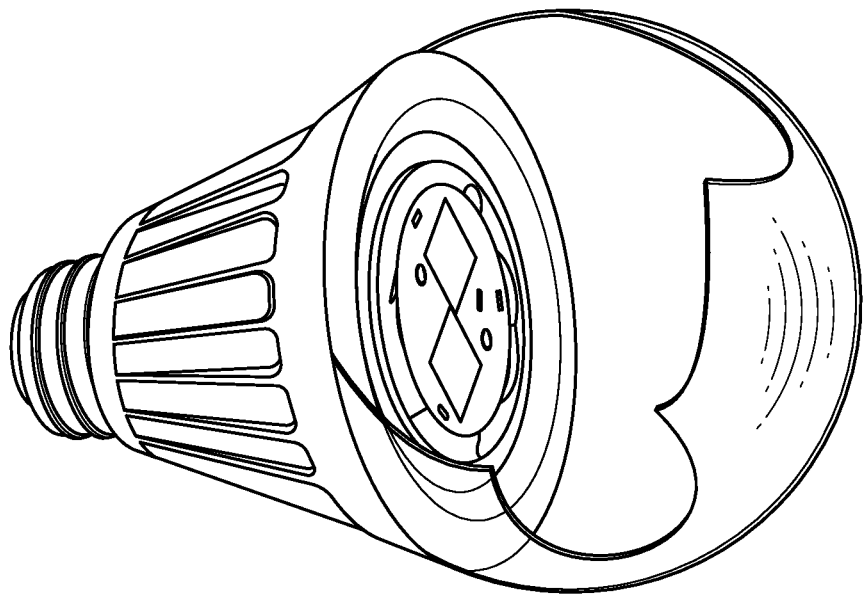
FIG. 5 is a view of an EcoSmart™ bulb showing an aluminum-core (metal core) LED circuit board mounted in an aluminum heatsink, with external wiring going down inside to the driver board housed inside the heatsink/base.
Figure 6:
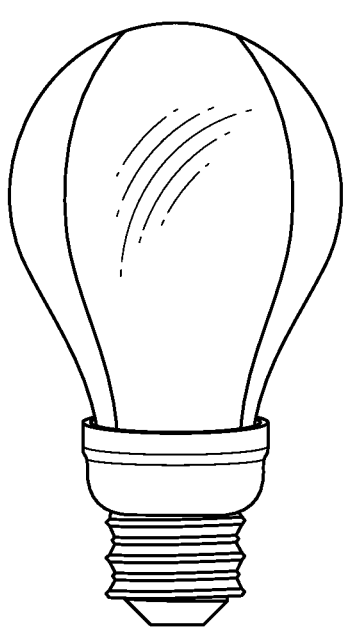
FIG. 6 is a view of a Best Buy™ 60 W bulb, which has a three-petal aluminum heatsink to which LED circuit boards screwed, then these are wired into the base where the driver circuit board(s) are. A translucent plastic shell is used between the aluminum heatsink "petals", and such shells are typically attached by means such as an adhesive.
Figure 7:
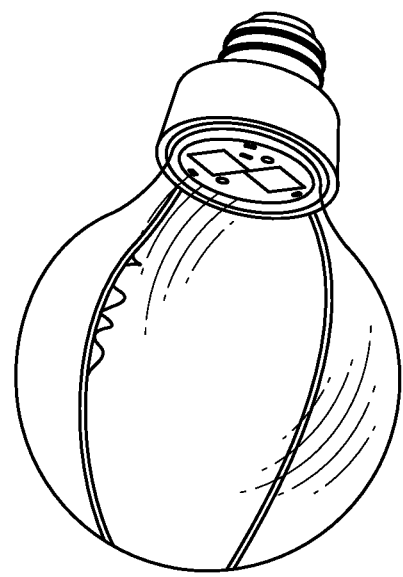
FIG. 7 is a further view of the Best Buy™ 60 W bulb, showing an interior.
Figure 8:
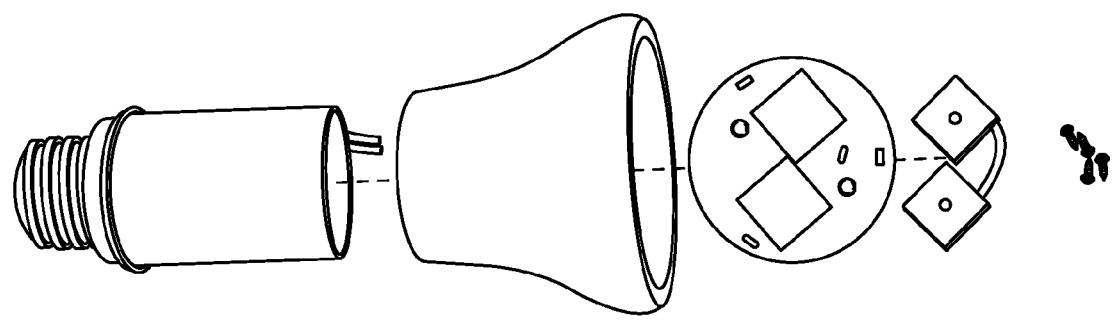
FIG. 8 is a view of the LG™ "snocone", which uses a similar design as the EcoSmart™ bulb.
Figure 9:
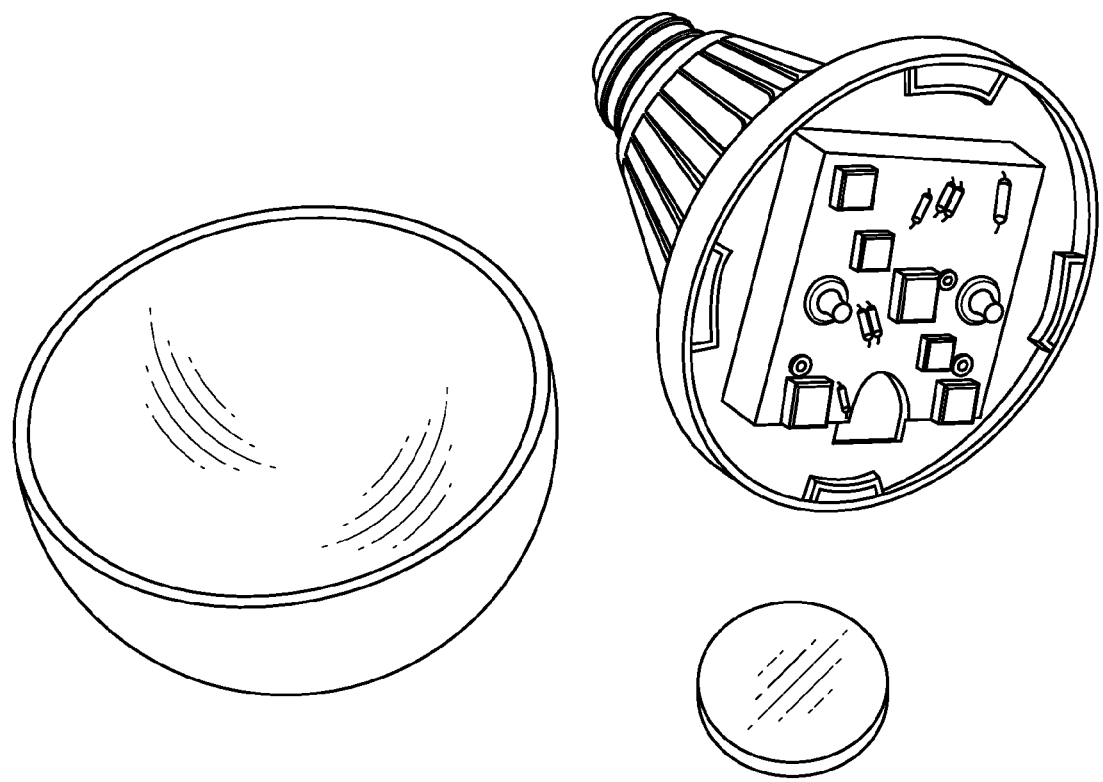
FIG. 9 is a view of an LED bulb from TESS Corp., which has multiple intense LED sources, two of these output 429 lumens at 8.6 W.
Figure 10:
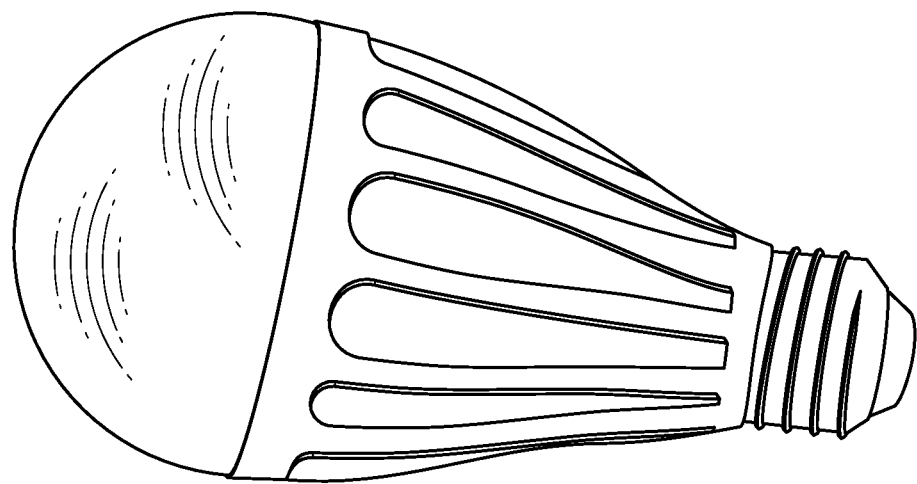
FIG. 10 is a view of a Maxxima™ LED bulb.
Figure 11:
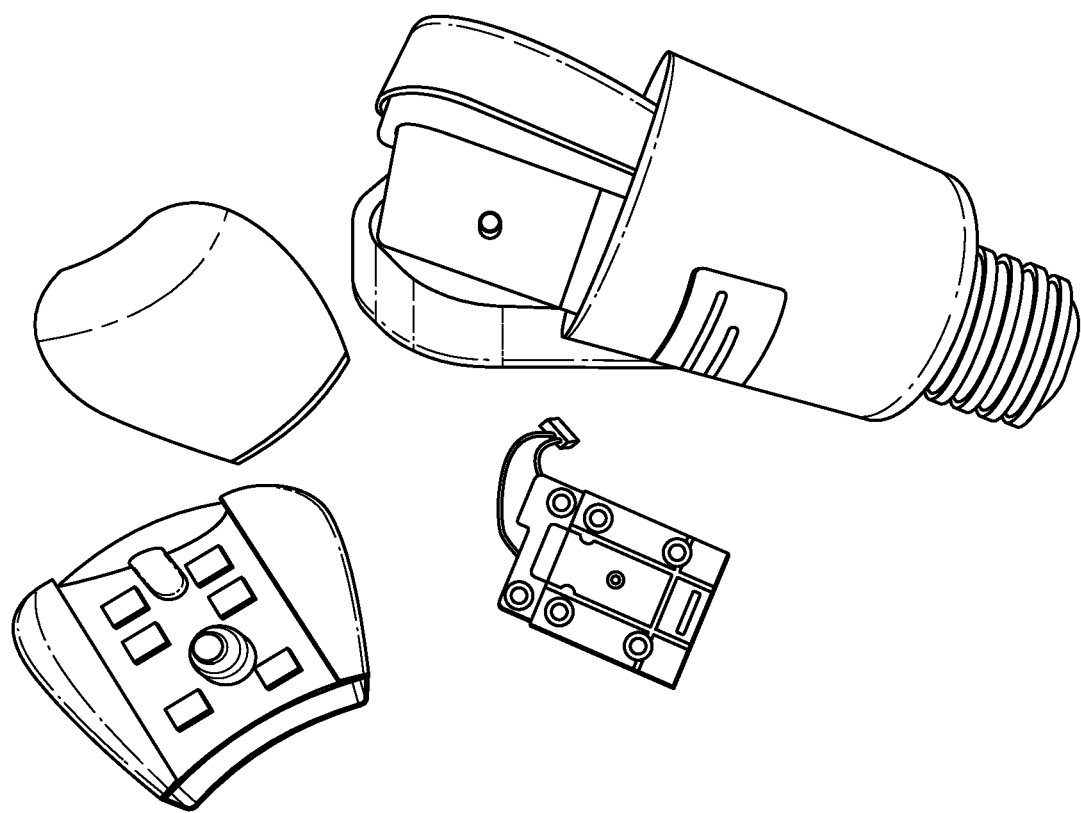
FIG. 11 is a view of a Phillips™ LED bulb, from blog.makezine.com. The aluminum core LED carrier board has a connector, which screws to the large heatsink. Also shown are a white plastic reflector and a remote phosphor (yellow—this converts light to perceived white when irradiated with blue light emanating from the LEDs) plastic cover.
Figure 12:
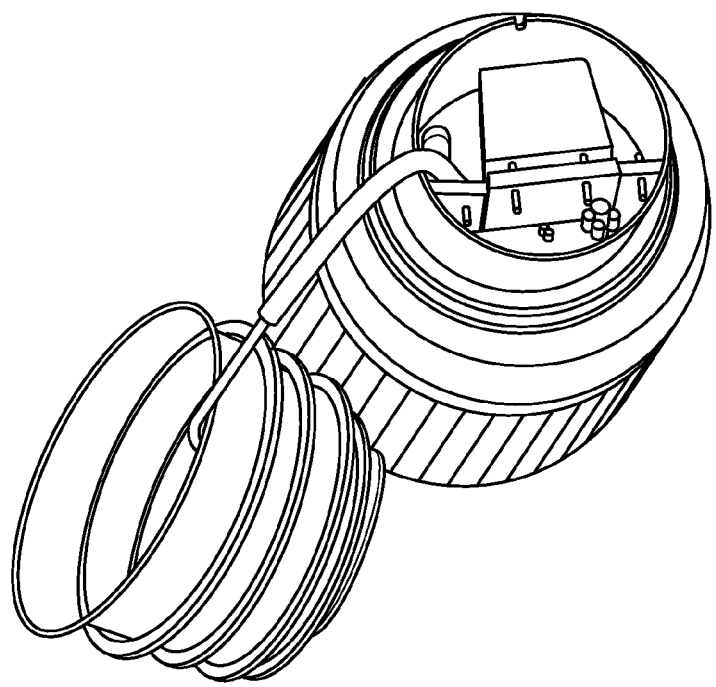
FIG. 12 shows the circuit board of FIG. 10, with a driver, which slides inside the aluminum heatsink and connect via soldered wire to the screw caps and connectors to the LED sectors.
Figure 13:
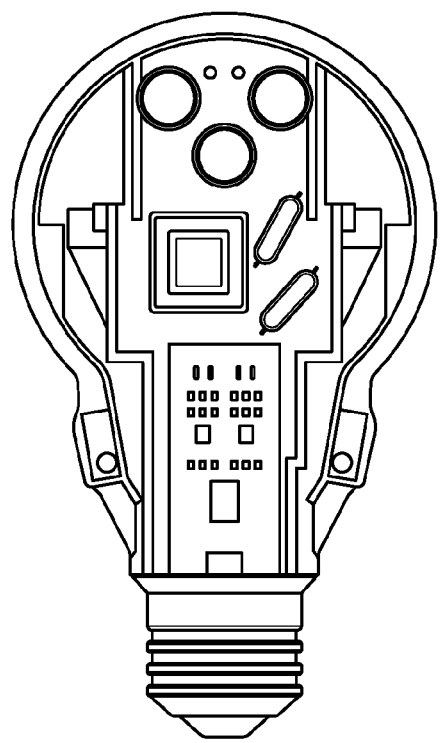
FIG. 13 is a cutaway view of a 3M™ LED bulb.
Figure 14:
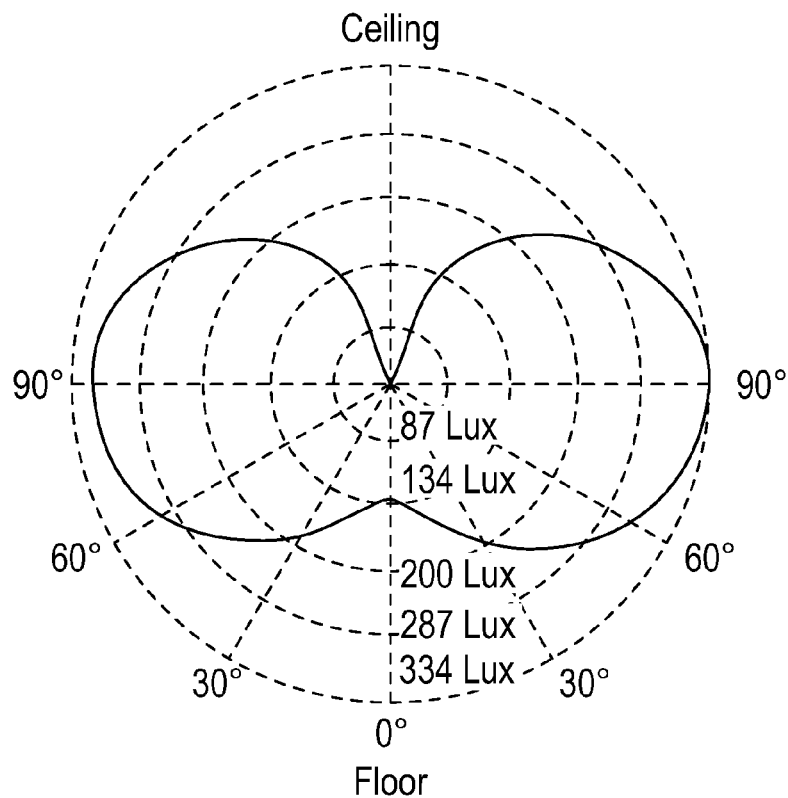
FIG. 14 is a light pattern for an A19 replacement LED bulb by Cree™.
Figure 15:
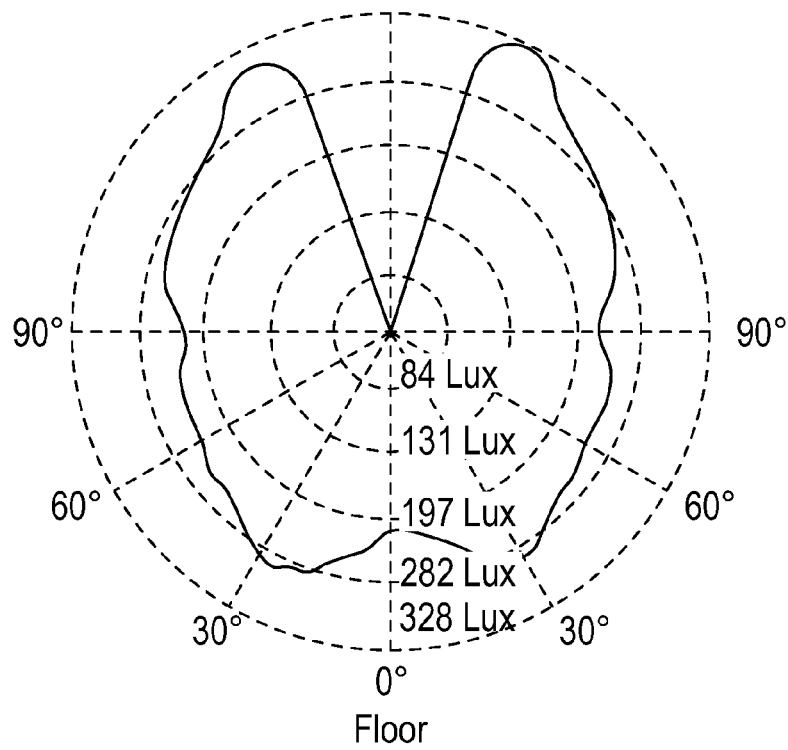
FIG. 15 is a light pattern for an A19 replacement LED "Lighting Science" bulb by EcoSmart™.
Figure 16:
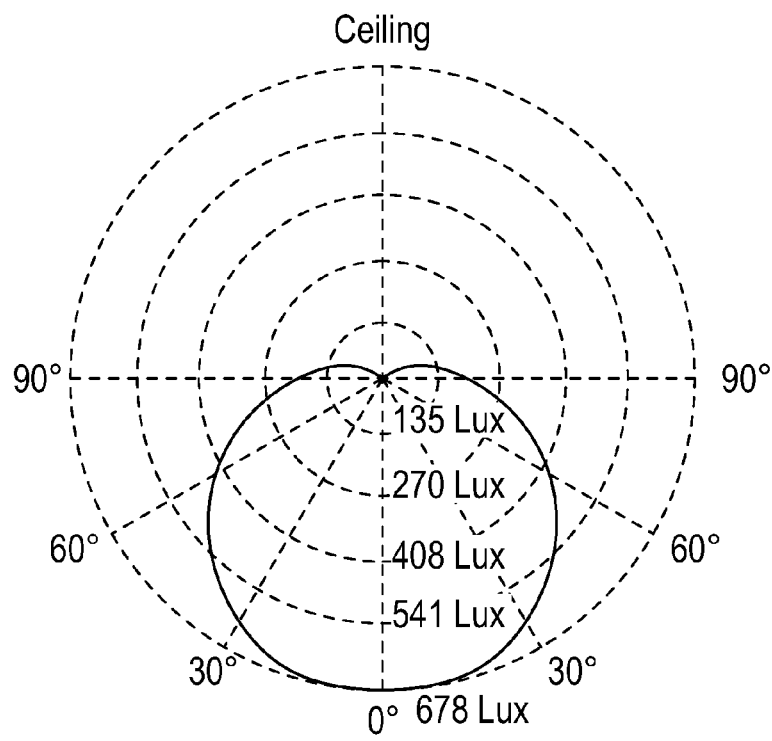
FIG. 16 is a light pattern for an A19 replacement LED Maxxima "snocone" style bulb.
Figure 17:
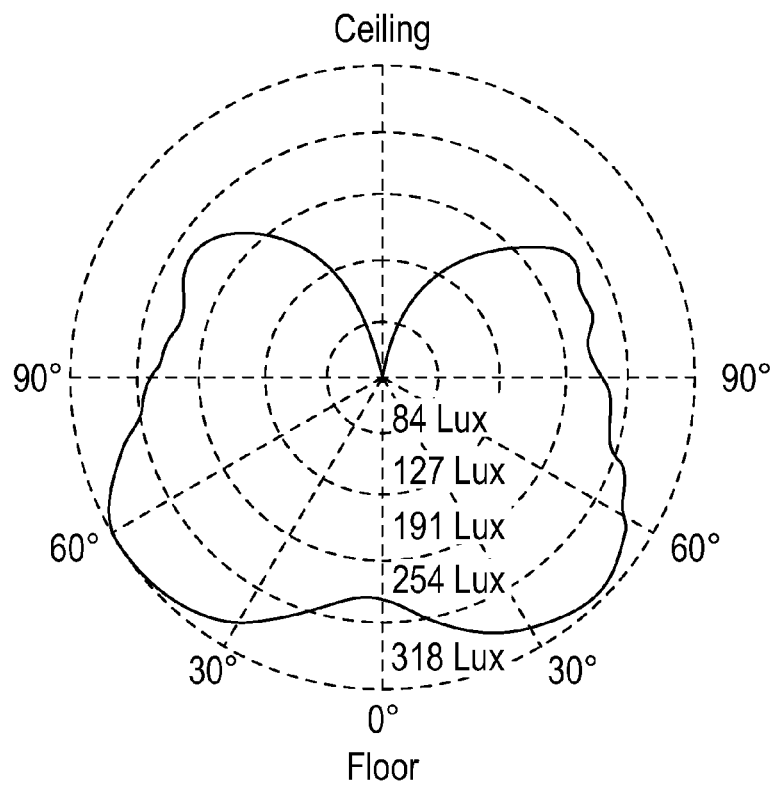
FIG. 17 is a light pattern for an A19 replacement compact fluorescent lamp by Mirabella.
Figure 18:
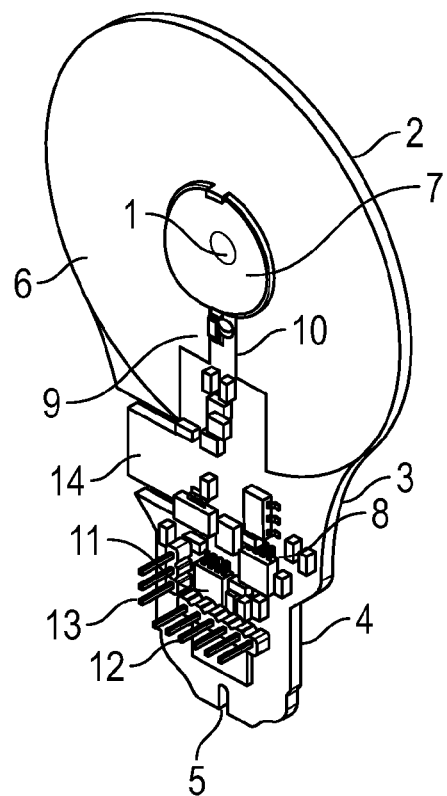
FIG. 18 is a perspective view of an LED lamp in accordance with an embodiment of the present disclosure.

In the various embodiments presented herein from FIG. 18 onward, compatibility with the Edison screw base, known as "E26" can be incorporated, although variations could use other bases, such as bayonets. Electrical connections in the case of the Edison screw base are made with "hot" and "neutral" wiring to the AC mains, usually with no provision for a separate ground or earth connection. Electrical shock prevention is accomplished by galvanic isolation of circuits from possible touch points and by a "primary insulation" that is intended to provide a dielectric barrier between hazardous voltages and, generally, the human body in order to prevent more than several milliamps of current from flowing though the body, which could cause serious injury or death.

Various objectives were to create an optimum light pattern, to provide for heat removal in all orientations, to provide reliable electrical connections, to minimize or eliminate manual assembly and labor and utilize machine assembly as much as possible, to comply with the ANSI A19 standard for light center and sizing constraints, for lightbulbs required to meet such specifications, and to eliminate or minimize the use of hazardous and/or toxic materials including lead, mercury, chromium, cadmium, and nickel. All of these are accomplished in various embodiments presented herein, which further achieve low cost by enabling machine assembly methods.

FIG. 18 is a perspective view of an LED lamp in accordance with an embodiment of the present disclosure. Among other details, FIG. 18 shows a substrate (2), an electronic circuit (8), a light source (1) such as one or more LEDs positioned at a light center of the LED lamp, a lens (7) attached to the light source (1), a thermally conductive and optically reflective area (6) acting as a heatsink for the light source (1), one or more connectors (12, 13) for a communication port, and castellations (4) for rotary insertion of a base of the LED lamp into a threaded socket. Embodiments may have various combinations of these features, which are further discussed below.

Figure 19:
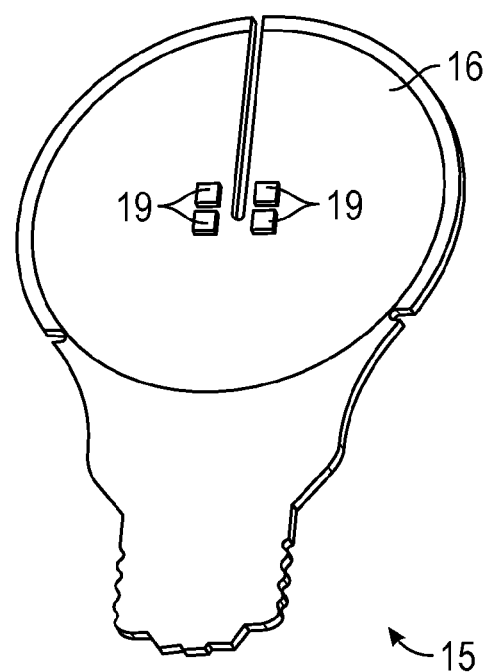
FIG. 19 is a perspective view of an embodiment of the LED lamp with a mating slot.
Figure 20:
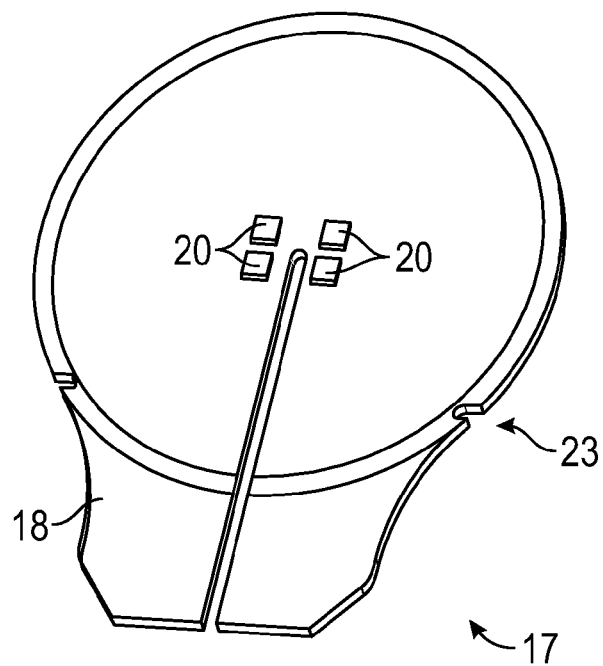
FIG. 20 is a perspective view of an embodiment of the LED lamp, with a mating slot complementary to the mating slot of FIG. 19.
Figure 21:
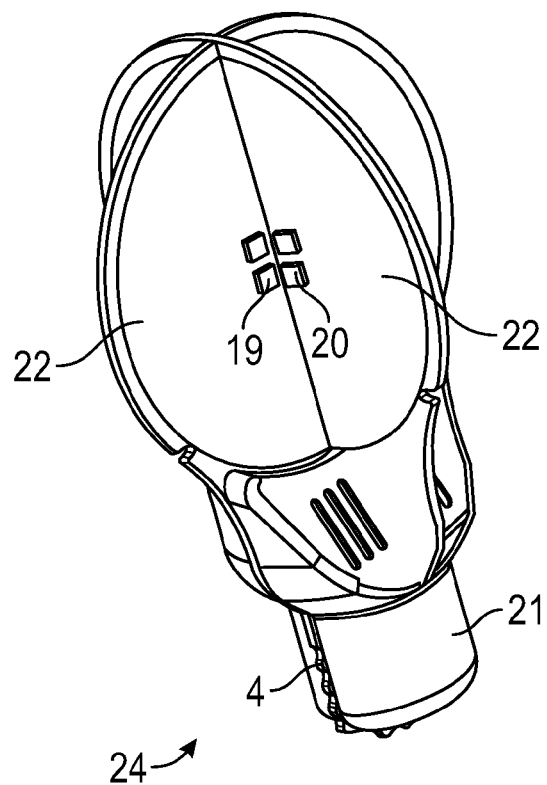
FIG. 21 is a perspective view of an embodiment of the LED lamp, made by assembling the embodiment of FIG. 19 and the embodiment of FIG. 20 together. A covering shell is not shown for clarity, and may or may not be present for the purposes of a shell previously described, or otherwise.

FIGS. 19-21 show further embodiments of the LED lamp, made with more than one substrate (2). FIG. 19 is a perspective view of an embodiment of the LED lamp with a mating slot. FIG. 20 is a perspective view of an embodiment of the LED lamp, with a mating slot complementary to the mating slot of FIG. 19. FIG. 21 is a perspective view of an embodiment of the LED lamp, made by assembling the embodiment of FIG. 19 and the embodiment of FIG. 20 together with the mating slots engaged. Various embodiments of the LED lamp can have a single substrate (2) with one or more light sources (1), as shown in FIG. 18, a single substrate (2) coupled with a further single substrate (2) and multiple light sources (1) as shown in FIGS. 19-21, or further multiples of the single substrate (2) each with one, two, four, eight, or other numbers of multiple light sources (1). Each face of the single substrate (2) can have one light source (1), or multiple light sources (1). Components or features to stabilize or position and/or fix the substrates to each other, as well as any outer shell are not shown. If an outer shell is utilized, it may be ventilated by any means or may consist of a high thermal conductivity or very thin material to enhance the transfer of heat from within the shell. The shell may also provide a thermal conduction path from thermal sources within the shell, including any air, gas, fluid, phase-change material, or liquid therein.

Various embodiments of the LED lamp from FIG. 18 onward have a light source (1), comprised of a singular or plurality of light sources such as LED, incandescent, discharge, halogen, OLED, LASER, plasma, phosphorescent, fluorescent or other contemporary light source technologies, where the arrangement of the singular or plurality of light sources is arranged to form a close approximation of a point or line source, or any other intentional light source pattern, having a light center that facilitates the design and implementation of auxiliary light ray processing devices such as lenses, reflectors, secondary light or radiation emitting devices and holographic imaging devices either within, or within proximity of, the light source (1). The light source (1) may radiate light in any pattern and a plurality of devices may be used to facilitate light emission in multiple directions. The light sources may be in elemental form (such as die), singlet or multiple individual die, with or without phosphors and lensing, and with or without signal conditioning, quantizing, switching, control, and active cooling, devices and circuits.

The light source (1) is then electrically and mechanically attached to a more or less planar substrate (2) which, in a first embodiment, comprises an electrically insulating substrate. In a second embodiment, the substrate (2) includes an electrically conductive substrate. In one embodiment the substrate, partially or in entirety, is post-formed into a non-planar shape.

In some embodiments, a property of the substrate is not a good thermal conductor, such as a glass/epoxy circuit board known commonly as G10, FR-4, FR-406, etc. In some embodiments, a property of the substrate is a good thermal conductor, such as aluminum, copper, graphite, carbon nanotube, diamond film, etc. It should be appreciated that differing portions of the substrate (2) may have differing properties. For example, a printed circuit board (PCB) with thickened copper may satisfy multiple properties and material such as aluminum or titanium can be processed to be selectively conductive or insulating.

In one embodiment, where a portion of the substrate (2) is a poor thermal conductor, a layer is created that provides a low thermal resistance, comprised of materials such as a graphite, copper, aluminum, diamond film, etc. In another embodiment of the second embodiment, a layer is created that provides a high electrical breakdown, low electrical conductivity, electrical insulating material such as aluminum oxide ("anodizing"), chemically or thermally applied materials such as ceramics or glasses, or vacuum deposited materials such as silicon-based compounds and carbon-based films like diamond.

In one embodiment, electrically conductive layers are created on an insulating layer to provide interconnect between circuit components and elements, which also can include connections to a singular or plurality of the light sources (1). In an alternate embodiment, an electrically and thermally conductive substrate has material removed, such as by chemical or machining means to form individualized electrical and thermal conductors. In a second alternative, individual conductors are formed additively by means such as vacuum deposition, ink or paste deposition, and electroforming.

Many embodiments have a projection of the maximum envelope prescribed by industry standards, as well as a familiar silhouette, and in many embodiments that maximum envelope is specified by ANSI for the A19 form factor "standard service light bulb". In at least one embodiment, the substrate consists of a planar FR-406 insulating material and places the light sources at an "optical center". In some embodiments, the light sources (1) are placed on both sides of the substrate (2) with the light source(s) optical centroid at the optical center. In one embodiment, the substrate is cut (3) in a convex arc about the optical center, such as having an approximately 34.29 mm radius, circumscribing approximately 255 degrees. The "primary shape" being described for one embodiment, in further embodiments, may be punctuated with slits and other features. The convex arc is then met at a vertical tangent by a concave arc, such as having an approximately 39.538 mm concave radius, circumscribing approximately 38 degrees. In some embodiments, this concave arc is then tangentially met by an approximately 6.35 mm radius convex arc that circumscribes approximately 45 degrees, the far end which meets a 45 degree chamfer of approximately 6 mm in length. In some embodiments, the 45 degree chamfer then meets the "vertical mating section", which is nominally vertical and displaced horizontally from the optical/geometric centerline by a standards-specific dimension such as approximately 13 mm.

The vertical mating section in one embodiment is dimensioned such that, despite the primarily planar geometry of the substrate, it will mate with standard lamp base sockets, such as E26 (used in some embodiments) and E27 screw bases and GU-24 pin base sockets. The E26 screw base, or Edison base, is specified as 7 threads per inch, with radiused thread profile using a 0.0469 inch radius and a maximum root diameter of 0.974 inches. In one embodiment, the thread profile is cut into the edge of the substrate, compensating accordingly since a square substrate edge will usually result. In another embodiment the edge is filleted to closely approximate a rotation about the central axis. In a further embodiment, a separate conductive, insulating, or a combination thereof, 2 dimensional or three dimensional "lamp base" is attached.

In another embodiment, "castellations" (4) (which may also be called crenations, or crenellations) are created by means such as drilling 3/32 inch vias on thread pitch centers on both left and right sides during the processing of the substrate, with the opposite sides being offset vertically by a half thread pitch. This method, in some embodiments, yields the ability to work with both left handed and right handed threaded sockets without any changes to the substrate layout or geometry. During the excise of the outline from a panel by milling, the outline is milled such that the milling operation occurs approximately at or outside the midpoint of the thread crest and root, where the tangency occurs as well as a change in slope. This allows the thread root to have remaining conductive material from the prior via to make electrical (and possibly thermal) contact with the lamp socket. In another embodiment, no castellation vias are used and the thread profile is milled into the edge of the board, fully implementing the thread profile of root and thread, on totality, partiality, or spatially oversampled, with appropriate root diameter compensation (for the flat milling operations), with left and right sides of the vertical mating section being offset by a half thread pitch. These edges are then "edge plated" or "slot plated", which is a known operation by substrate suppliers. In another embodiment, the substrate outline is routed to create fitting mating features such as "bayonet" pins on the edges with the appropriate edge plating to emulate the placement of either cylindrical, or cylindrical bi-pins with a "T" cross-section, or slots to facilitate insertion of conductive or insulating pins as required.

The vertical sides of the vertical mating section, left and right, make electrical contact with the screw base socket, which is a connection such as "neutral". Ground is not present in Edison screw bases, which presents problems with safety. The very bottom extent (5) of the substrate profile consists of an electrical connection, such as to "hot", which in some embodiments is an edge plated area on the bottom edge. In another embodiment, a conductive device, conductor, structure, or layer is attached, mounted, applied, or connected to the conductor(s) on the substrate which then makes contact be extending beyond the bottom edge of the substrate, eliminating the edge plating step.

In order to conduct and eventually radiate or convect heat away from the light source(s), a thermally conductive area ("TCA") (6) is provided that provides a low thermal resistivity path from the heat source (the light emitting device(s)) to its largest extent. The surface area of the TCA (6) is then used to transfer heat by methods such as radiated and conductive, or as is the case in many embodiments, by convective means, possibly by radiated as well. The TCA (6) may have its thermal performance enhanced by such means as adding layers, coatings, materials, or geometrically by adding thickness or increasing surface area by surface treatments such as etching channels, plating or bonding fins or pins, or increasing emissivity by anodizing, by chemical treatments such as patinas or blackening copper, or by bonding graphite or inks. In many embodiments, the TCA (6) is comprised of "thick copper" and is part of the substrate processing. The substrate processing can enhance the copper thickness by methods such as the application of thicker foils and subtractively processing them either prior or post bonding to the substrate, or by use of a seed layer of conductive material, such as copper, copper foil, graphite, conductive ink, or electroless conductive materials; which are then etched as, or if, needed, then electroplated to the larger thickness. In another embodiment, the thicker metal is applied using deposition methods such as vacuum deposition or flame spraying. The thicker copper may be further processed by subtractive or additive methods to provide a means for attaching circuit nodes to the thicker copper or thermal material.

The light source (1) is generally a Lambertian source or possibly a point source or limited length line, source, with light intensities varying with angle in any plane orthogonal to the substrate plane. Ideally, there would be no variation and light intensity would be the same, irrespective of angle, but light distribution clearly is not ideal in many of the implementations of "three dimensional" LED lamps as shown in the previous figures, with the popular "snocone" implementations being among the most uneven. In present embodiments, a corrective lens (7) may be used to correct the light pattern from the light source(s) (1) to a near-ideal pattern, such as over a full hemisphere or cylinder, while preserving the light center required by external optical processing elements, such as parabolic reflectors, which assume point, or rarely line, sources. In another embodiment, a "remote phosphor" dome or lens (7), which produces a color shifted, filtered, narrowed or broadened spectrum, and may produce light by means such as phosphorescence or fluorescence, as a result of being impinged with energy from a source such as a blue LED, x-ray source, electrical discharge, laser, or other such high energy photon, electromagnetic, acoustic, or particle source. In another embodiment, a lens function is combined with the "remote phosphor" functionality in a dome or lens (7). In yet another embodiment a diffuser is used either in combination with a corrective lens, or as a light diffusion device covering the light sources, to reduce glare and provide a more uniform light source. In one embodiment, the element (7) serves as a protective device against such things as dust, dirt, contaminants, chemical attack, or mechanical damage. The element (7) can be a separate or integrated device with the light source or the substrate. The element (7) can have polarization an alignment features for alignment with, or of, devices and structures such as the substrate (2), the element (7) or the light source(s) (1). In one embodiment, the element (7) can be oriented, either as a singular unit, or as a plurality in an assembly, to perform a variable or quantized optical function such as filter, emitter, intensity distribution, intensity level, wavelength shift, polarization, collimation, beam width, or focal point adjustment. In one embodiment, the element (7) serves as a coupler to reduce losses in attaching devices such as a waveguide or amplifier.

With reference to FIGS. 19-21, in one embodiment, there are multiple substrates (15, 17) with TCAs (6). Each substrate (15, 17) provides electrical and thermal connections for a singular or a plurality of light sources (1). In one embodiment, the first substrate (15) has a slot (16). A second substrate (17) has a mating slot (18) such that the first and second substrates (15, 17) can mate by means known to those versed in the art, such as soldering, connectors, snap connections, mechanical means using the substrate material such as slots and tabs, conductive tabs, etc. In one embodiment, the first substrate (15) has both the light sources (19) and all supporting circuits on it and the second substrate (17) has light sources (20) on it. A means is provided to connect, electrically from the light sources on the second substrate to the first substrate. In one embodiment, features are provided in a protective cover (21) that may provide mechanical stability and/or protect electrical connections. Rather than being limited in power dissipation, e.g., about 10 W of heat per TCA (6) in an A19 form factor, which delivers a net light output at today's efficacy levels of about 800 lumens, or the equivalent of a 60 W incandescent light bulb, additional substrates with TCAs (6) increase the total TCA (6) surface area. In one embodiment, (24) adding one additional TCA (6) doubles the power dissipation capability, and therefore the lumen output to about 1600 lumens today which is equivalent to a 100 W incandescent light bulb. In another embodiment the TCA is comprised of a "standard" thickness circuit board foil and the second substrate is used to increase the surface area to compensate for the lower heat spreading capability of the thinner foil. The substrates, being more or less planar, allow single or double-sided surface mount manufacturing methods, ending with the assembly of a plurality of substrates, any protective covers, as well as any corrective lenses, diffusers, or reflectors that may be needed. In one embodiment, the TCA (6) metallization (22), such as polished nickel or chromium, is used as an integrated reflector as well as a heat spreader and ambient air thermal exchanger.

In one embodiment, slots (23) are provided in the TCA (6) to accommodate lamp shade clips, a leftover of the incandescent bulb days where a spring wire pair of loops is used to clip onto the incandescent bulb envelope as a means to attach a lamp shade. It is left to those versed in the art to provide additional constraint structure and devices for mounting said clips to stabilize the lamp shade.

Figure 22:
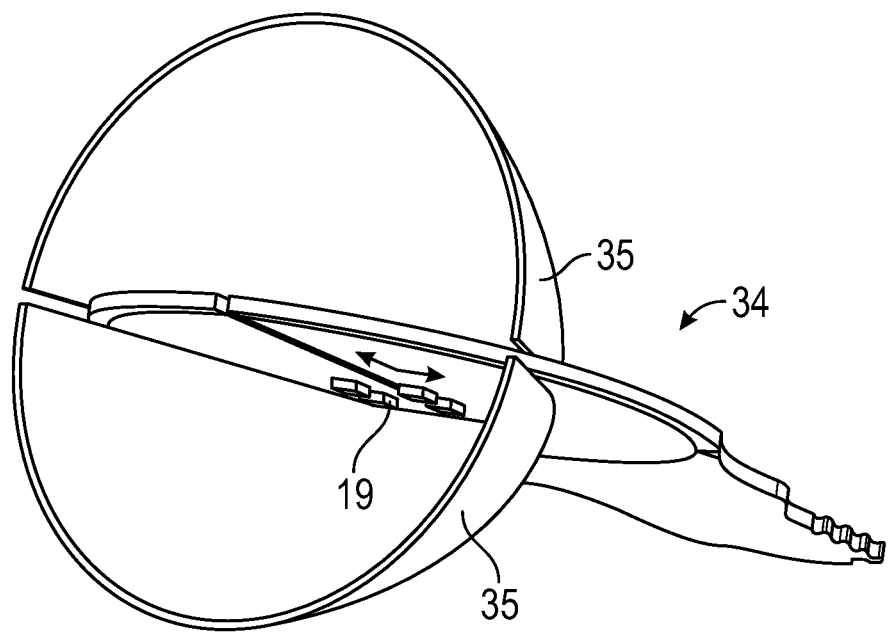
FIG. 22 is a perspective view of an LED lamp with a parabolic reflector.

FIG. 22 is a perspective view of an LED lamp with a parabolic reflector. In one embodiment, the ability to cluster light sources on the TCA (6) as near-perfect point or line sources lends itself to a PAR (Parabolic Aluminized Reflector) lamp (34) configuration. In many embodiments, a singular substrate with TCAs (6) is used. In another embodiment, a plurality of substrates and TCAs (6) is used, as previously discussed. In one embodiment a reflector, constructed from materials such as electroformed nickel, copper, plastic, or chrome or aluminum, is affixed to the TCA (6) by means well known to those versed in the art. In one embodiment, the locating features made of solderable materials are used to solder the reflector to the TCA (6). In another embodiment, the reflector is used as a further thermally conductive material that provides a larger area of exposure to the surroundings to dissipate heat. In the embodiment of a PAR lamp (34) shown in FIG. 22, an arrangement of parabolic reflectors (35) are shown, with the further provisioning of an additional substrate not shown for clarity. As can be seen, the light sources (19) are clustered, providing the closest approximation to a point light source that is possible for a given light emission surface area. Also not shown are seals against dust and moisture, ventilating or cooling features, or any optics, such as diffusers or lenses related to the reflector or substrate. The depictions in the diagrams are schematic and illustrative and are not optimized for form factor limitations.

With reference back to FIG. 18, in many embodiments, a circuit (8) is provided for electronic functions such as control, monitoring, maintenance, up conversion, down conversion, filtering, safety, illuminance, communications, interface, or signal conditioning. In one embodiment, the circuit (8) consists of active and passive elements and devices on both sides of the substrate, including such devices as inductors, capacitors, transistors, resistors, and integrated circuits. In one embodiment, the circuit (8) monitors the current and voltage to/from hot and neutral mains connections, determines any difference or threshold levels, and invokes protection, adjustment, and reporting such as shutdown, clamping, crowbarring, alarming, increasing or decreasing a control parameter or output, and messaging. In one embodiment, the circuit (8) delivers a predetermined maximum amplitude to the light source(s) such as current. In another embodiment, the circuit (8) monitors the input waveform and adjusts control parameters or output, such as switching into the circuit, or bypassing, singular or a plurality of LEDs such that their forward voltages in combination with the voltages in other control circuits, such as a current source, equals the input waveform voltage or current. In one embodiment, all of the LEDs are bypassed when all of the forward voltages are excessive, leaving the current source to sink current, facilitating dimming control. In one embodiment, the switching or bypassing of singular or a plurality of LEDs is binary weighted. In one embodiment, the number of Vf levels are quantized such that when used on a certain line frequency system, the total number of switchings does not exceed a predetermined number of times per period of time. In one such embodiment, the predetermined number of times per period of time is bounded by the minimum operating frequency requiring electromagnetic interference compliance being 9,000 Hz and in one embodiment the line frequency is 60 Hz, the Vf is comprised of two 3V LEDs in series to make 6V, the line voltage is 120 VAC+/−10% and 187Vpeak resulting in no more than 32 levels between 0V and 187V or 64 switchings per half cycle or 128 switchings in a 60 Hz cycle resulting in 7,620 level switchings per second. In another embodiment, the frequency is fixed to 9,000 Hz, or another such number setting a maximum desired frequency of operation, and the combination of Vf of individual, or a plurality of, LED combinations and a current source and other circuits if needed is set to be less than or equal to the instant line voltage, or some other reference representation, at the time of each of the 9,000, or other such number, clock transitions or levels or cycles. In another embodiment, the circuit (8) maintains a constant ratio of input voltage to output current or a constant phase of input voltage to output current in order to appear as a circuit element such as a resistive or reactive load impedance of constant or preset or determined value. IT should be appreciated that the use of "input voltage" also refers to any representation of a desired waveform throughout. In yet another embodiment, the circuit (8) holds a control parameter or output value constant. In one embodiment, the circuit (8) monitors temperature and changes control parameters or adjusts the output to maintain temperature, or to keep from exceeding maximum temperatures, or to cause the system or devices to not exceed minimum temperatures. In one embodiment the circuit (8) consists of a function known to those versed in the art as a "driver". In one embodiment, the circuit (8) monitors the output of the light source(s) (1) or the element (7) and adjusts control parameters or output to maintain a preset or setpoint level or condition, or to set limits on operating levels. In one embodiment, a special code is stored upon the device, such as a serial number in memory or a serialized microcontroller as is found in ARM processors. This code is then transmitted by modulating the intensity by a means such as switching the LEDs off at predetermined points in time that are intentionally visible or invisible to the human eye. In one embodiment, this modulation occurs at a fixed point in the AC waveform, such as the expected peak voltage point. In one embodiment, the code in its entirety is transmitted at random points in time, though still at an expected point on the AC waveform. In one embodiment, a device is provided to allow the detection and reading of light pulses, or their absence, at certain points in the AC waveform, allowing reconstruction of the devices serial number or device code. In one embodiment, a database is kept of such codes or serial numbers for the purposes of establishing authorized use of the device at a particular location. In one embodiment, a portable or fixed location device monitors or samples the LED modulation and determines conditions such as theft, maintenance or fault codes, system telemetry, building or power management, or sensor communications. In another embodiment the modulation can be received from other devices or systems for purposes such as control, theft deterrence, fault coding, security, etc. In one embodiment, a line of sight or reflector is used for purposes such as room occupancy, security, etc.

Figure 23:
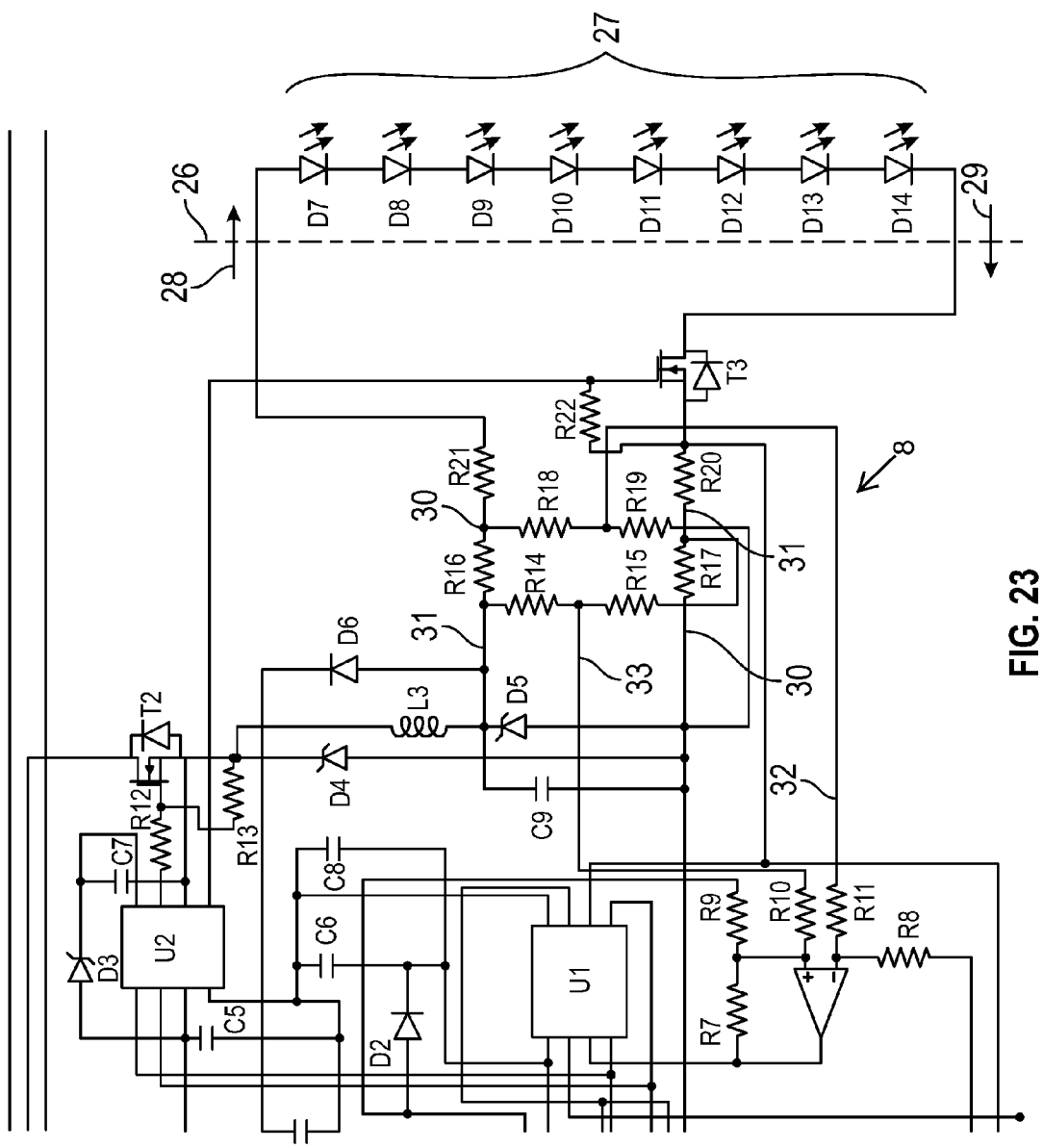
FIG. 23 is a circuit diagram of an electronic driver circuit that uses a buck converter to provide power to a string of LEDs in an embodiment of the LED lamp, detects current through the LEDs, and shuts off power to the LEDs under certain conditions.

FIG. 23 is a circuit diagram of an electronic driver circuit that uses a power converter, such as a buck converter, to provide power to a string of LEDs in an embodiment of the LED lamp, detects current through the LEDs, and shuts off power to the LEDs under certain conditions. Without a ground connection, a conventional ground fault circuit interrupter circuit is not possible for safety. In one embodiment the current in the hot side of the circuit, near the entry point to the unit or at or in an active device nearest thereto, is compared to the current in the neutral side of the circuit near the entry point to the unit or at or in an active device nearest thereto. In another embodiment, the current exiting a protected housing, destined for remote circuits or equipment is compared to the current entering the protected housing. Safety standards allow a maximum "leakage current", which is assumed to be directed through personnel or equipment. One embodiment compares the difference between the neutral and hot side currents, or a representation thereof, and when that difference, due to external leakage through such things as personnel, fauna, or equipment, exceeds the leakage current limit, the device is reverted to a safe mode such as being turned off, disconnected, or "crowbarred" by shorting the line and neutral nodes to activate circuit protection shut down devices such as fuses or circuit breakers. In one embodiment a delay is introduced to prevent reactivation of the circuit within a predetermined period of time. In another embodiment an accounting of events, or their timing, disables the device for a predetermined time, which could be indefinitely or in another or the same embodiment until the power is cycles or the system is otherwise commanded or signaled to resume normal operation. One embodiment is shown (8). The current exiting and entering a housing, e.g., protective cover (21) crosses the dashed line (26) into the TCA (6) to power the light sources (1,19, 20, 27). The TCA (6) is subject to being connected to an object or person (or fauna) should an insulation failure occur in a cover insulating dielectric, such as a molded plastic or conformal coating or film, thereupon. Since current normally flows in a loop, we expect current (28) to equal current (29). In one example, a scratch is present in the dielectric film as a first fault. A human touches the scratch and provides a path for some current to flow to earth. This now means, in one half of the AC cycle (current flows to/from earth are opposite in the other half cycle) current (29) is less than current (28) by the amount of current flowing to earth through the person. There are safety limits on this amount of current, a current threshold that may not be exceeded. One embodiment provides a means for sensing this difference in current (28) and (29), with one embodiment using a resistor network such as the highly sensitive balanced Wheatstone bridge configuration comprised of the four elements R16, (R18+R19), R17, and (R15+R14). Other means, such as hall sensors, current transformers, etc., may also be used. Resistor R16 senses current (28) and R17 senses current (29). Resistor R20 is merely used for current control by the driver for the LEDs and may or may not be present in various embodiments. One embodiment measures the voltage (31) and compares it to the voltage (30)—both should be approximately equal if the currents (28) and (29) are more or less equal and the resistor elements of the bridge are more or less balanced, which they are by design. Resistor pairs R14/R15 and R18/R19 form voltage dividers for voltages (31) and (30) respectively, bringing the voltages within compliance and common mode range of the subsequent measurement circuits. Because the ratio of peak current to the leakage current through the human is so great, a low offset amplifier, X3A is used in one embodiment to amplify the current difference voltage analogs by a factor of 100. In one embodiment, a microcontroller U1 utilizes an integrated analog to digital converter to convert the amplified/conditioned signal from X3A into a binary value that can be conditioned and filtered, if necessary and then compared to a preset threshold. If the threshold is exceeded, one embodiment shuts down the power conversion by shutting off transistor switches T2 and T3. In another embodiment a double pole relay is used to fully disconnect any line and neutral connections to the two wires crossing the dashed line (26). In another embodiment a crowbar circuit is triggered which then activates circuit protection devices, such as fuses and circuit breakers either within the system or external to it. In other embodiments, the system is comprised of an AC-powered, or other shock hazard, apparatus other than one comprised in whole or in part of LEDs.

There is a class of lighting luminaires that mount to a ceiling and utilize one or a plurality of light bulbs in horizontal orientation. Using lamps that distribute light cylindrically or spherically, which describes many known LED, CFL, halogen, and incandescent, lamps, half of the light is directed towards the ceiling plane, or otherwise in an undesirable direction. In most luminaires, the area above the lamps is not a highly polished reflector. With this consideration, up to half of the light output may be wasted. As an example, most of these luminaires use two 60 W incandescent lamps, with their longest axis of symmetry being horizontal. A typical dual LED installation would use 20 W of electrical power, again wasting half the light in an upward direction, even worse for a "snocone", since it will beam light out sideways, and provide little illumination below the luminaire, where the light is needed. Research has shown that lamp sockets are not consistently oriented and merely screwing the bulb in results in an inconsistent lamp orientation between socket and bulb combinations—it can typically be 0 degrees or 180 degrees in the socket as far as where it stops when fully screwed in. The center spring contact, in the case of the Edison screw base socket is also inconsistent in its connection range of compliance to where backing off the light bulb by amount of being screwed in cannot achieve proper bulb orientation if a bulb were created with a hemispherical light pattern.

One embodiment has an orientation sensor or device that determines bulb orientation. Some embodiments have a plurality of directional light sources. In one embodiment, there are two light sources (1) and optical elements, e.g., lens (7), with each pair (1, 7) directing light in a full or partial hemisphere above the surface of the substrate. The sensor or device then acts to turn off, or turn on, one of the two light sources (1) and/or optical elements, e.g., lens (7) by electrical, mechanical, photonic, or other means, or when the longest axis of symmetry is vertical with the screw base up or down both sides are activated.

In one embodiment, a singular or plurality of two terminal electrical devices, LEDs (1), as the light sources (1), are interconnected, with one on each side of the substrate. In one embodiment incoming current comes up to the light source (1) on the backside of the substrate from a rectifier and filter circuit (back side of the substrate and therefore not shown). The second terminal then connects to a via ("common terminal") which brings an electrical connection to the top side light source (1)'s first terminal. The light source (1)'s second terminal is then connected to the driver circuit (8). A pair of common surface mount jumpers (9), a conductive metal strap that joins two spatially separated surface mount pads electrically by "jumping over" and not being in contact with the substrate or any conductor between the two surface mount pads, are each placed on two pads, one on each side of the substrate. One of the pads on each side is connected to the common terminal. The jumper (9) on the backside has its second pad connected to the second terminal of the front side light source(s) (1). Conversely, the jumper (9) on the front (visible) side is connected to the first terminal of the backside light source(s) (1). The substrate has a large diameter via (10) placed under the jumpers (9), offset from their centers in one embodiment, and connected to the common terminal. In one embodiment the via (10) has a barrel, vee, or "u", instead of a cylindrical, cross section. Prior to placing the second conductor, a conductive element, such as a ball (shown inside (10)), is placed in the via (10) and the jumpers (9) are soldered to their pads. The captive ball's function is to connect the via (10) walls to either the top or the bottom jumper (9) when the bulb is horizontal. A barrel, vee, or "u", instead of a cylindrical, cross section prevents the via (10) connection in other bulb orientations. In one embodiment, the orientation switch or sensor is a component that is connected to the aforementioned pads, in another implementation, an orientation sensor or switch is connected to a driver circuit. In one embodiment, if the bulb is horizontal, the ball will connect the lower jumper (9) to the via (10). The via (10) is connected to the common terminal. Since the jumper (9) is connected to the LED (1) on the opposite side, the ball's connection will short out the top LED (1). The driver circuit (8) drives current to the two LEDs or other light sources (1) that were in series but on opposite sides of the substrate (2). With one LED or other light source (1) shorted, the second LED or other light source (1) is oblivious and continues to receive the same current from the driver circuit (8) as it did without its mate light source (1) shorted, which means it continues to put out the same amount of light. In one embodiment, a horizontal orientation increases the driver current slightly to account for some of the light that would have been reflected downwards by the luminaire for a conventional bulb design that does not incorporate present embodiments. So, a dual 60 W ceiling fixture's incandescent bulbs can be replaced by two LED lamps with embodiments of the presently disclosed orientation sensor, resulting in 10 W of power consumption for the same light output, respectively. This saves considerable power consumption as compared to 120 W for the dual 60 W conventional incandescent bulbs, or 20 W for two LED lamps of 10 W each.

In addition to the driver circuit (8), one embodiment has an intelligent device (11) such as a microcontroller or FPGA (field programmable gate array) to intelligently manage, communicate, control, and sense conditions and then provide control signals to the driver circuit (8). In one embodiment, the intelligent device (11) is an ATMEL AVR™ microcontroller. In another embodiment, it is an ARM™ based microcontroller. In yet another embodiment, the intelligent device (11) utilizes common operating systems or development tools such as Arduino™, Linux, iOS™, Android™, or a realtime operating system and programming languages such as assembler, C, BASIC, FORTH, etc. In one embodiment the intelligent device (11) is preprogrammed. In another embodiment, the intelligent device (11) can be programmed "in circuit" by a means such as a set of pads, by connection to the device pads or pins, through the use of a connector (12, 13), or by providing a method of programming via a communications protocol such as wireless, RS232, Infrared, serial, or universal serial bus (USB). In one embodiment, a USB connector is implemented simply with a pair of cutouts and circuit board traces (14) to allow secure programming of the light bulb by a wired connection with an intelligent or computing device. Further circuit board traces (14) couple components of the electronic circuit 8 to each other and to the light source (1). The intelligent device (11) monitors and controls the light bulb functions, interfaces to the outside world and to sensors, accepts different programming at varying times as needed, provides communications, facilitates functionality development, and controls the driver circuit (8). In one embodiment, the intelligent device (11) controls the dimming function (which facilitates on/off by that very function) of the light source(s) (1) using pulse width modulation (PWM). In another embodiment, the intelligent controller controls the analog dimming functions of the driver circuit (8). In one embodiment, a representation of the full wave rectified line voltage is presented to the device for conversion and analysis, facilitating brownout and blackout prediction, line voltage monitoring, and power line communications receptions for protocols such as X10. In one embodiment, the intelligent device (11) controls a plurality of drivers and their subsequent LEDs. In another embodiment the line voltage and waveshape is sensed and the driver is adjusted accordingly, such as a 120V AC lightbulb in normal operation encountering a blackout, another means is provided to switch in an auxiliary supply such as solar or a battery having a lower or higher DC voltage. In yet another embodiment a battery and a charger circuit is provided in the light bulb for short term illumination should power be disconnected. In a further embodiment, the lightbulb looks into its power inputs to see if a switch has been disconnected, determined by an extremely high impedance, or whether power has failed, determined by a finite impedance measurement. In yet another embodiment, a light source of differing characteristics is used as an alternative to the main light source and is activated by means such as a sensor measurement, communications link, or preprogrammed interval. In one embodiment, the main light source is a singular or plurality of LED(s) and the alternate light source is an infrared emitting LED or plurality of LEDs enabling security camera illumination with the room being dark in the visible range.

A set of programming and expansion connectors (12, 13) facilitate in system programming and provide access to every pin of the device and to an onboard regulator. An additional pair of pins provides access to full wave rectified AC line voltage. In one embodiment, pins are also provided to enable access to the TCA (6), enabling its use as a capacitance sensor for "touch switch" and gesture sensing. The expansion connectors are in a specified geometry that allows the attachment of a singular or plurality of circuit boards to enable additional hardware functionality, along with the attendant software applications ("apps") to control the light bulb. Such hardware includes functions such as: a more powerful microcontroller, Arduino or other generic or ubiquitous controls or accessories, motion sensors, audio sensors, microphone, audible devices, WiFi, Bluetooth, Zigbee, ISM band, GSM band, timers, batteries, clocks, displays, additional light sources and drivers, smartphone emulators, memory, port expanders, etc. What is also supported, in some embodiments, is not just the ability to put expansion boards on a light bulb, but also the ability to download, install and run apps, a developer site for light bulb apps and hardware development, and an apps store associated with a light bulb's software "apps" distribution. Apps create and increase the hardware functionality, and include such functions as time to on, time to off, time on, time off, dimming, clap on clap off clap dim, flashing, strobe, sound sensitive "color organ", smartphone control and communications, machine to machine communications, Internet control and status, web appliance, motion sensing and motion filtering, infrared remote control learning and controls, etc. With these capabilities, not only does LED lighting have long life, it also will have a long FUNCTIONAL life.

The use of the planar substrate, fabrication of multiple units on a panel or substrate, machine surface mount or bonded assembly of all components or subassemblies, and no hand assembly or soldering, means very low cost and high quality, yield, life, and reliability.

Further embodiments of the electronic circuit 8 are described below with reference to FIGS. 24-30. These embodiments provide shock hazard mitigation in non-magnetically-isolated power supplies.

Classical paradigms and approaches to voltage safety in power supply design, such as those found in solid state (or "LED") lighting are to implement a magnetically isolated and coupled power supply, topologies that are well known to those versed in the art. The magnetic isolation "floats" the secondary side of the transformer, thereby providing no voltage potential with respect to earth, mitigating the possibility of an electric shock. A transformer costs well over $1, typically $1.50 for general lighting applications, whereas an inductor is about $0.30. The transformer requires dual windings that are separated from each other by an insulator rated for more than 1000Volts. An inductor only needs to insulate wire to wire in the same winding, so can get away with significantly lower rated insulation. With two windings, and the insulation between them, transformers are usually much larger than an inductor for the same power rating.

Figure 24:
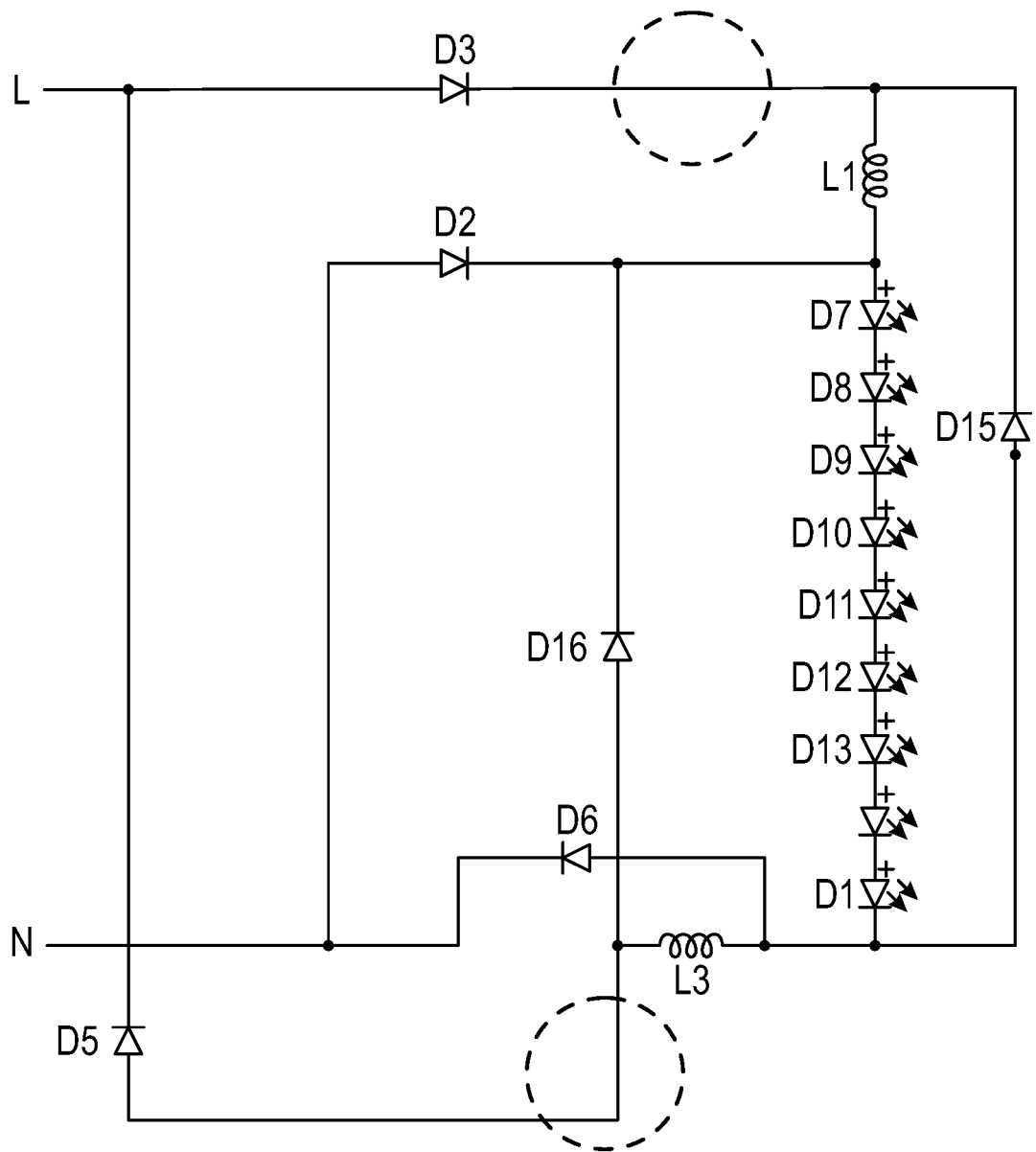
FIG. 24 is a circuit diagram of a further, non-magnetically coupled, electronic driver circuit for an embodiment of the LED lamp.

FIG. 24 is a circuit diagram of a further, non-magnetically coupled, electronic driver circuit for an embodiment of the LED lamp. This is a non-magnetically coupled, "safe" power supply. The LED string is referred to the neutral (N) side (at the breaker box) plus one diode (D2 or D6) $V_f$ forward voltage drop. A typical string of 1 W white LEDs, with a $V_f$ of 3V, in an application needing 900 lumens would need 9 devices, assuming an efficacy of 100 lumens/watt (it follows, one one-watt LED per 100 lumens). The string $V_f$ would then be 9 devices times three volts apiece, or 27V. Low safety-voltage limits are 35Vp-p, so adding the forward drop of one silicon (or other material or device type performing functions such as switching, current steering, or blocking) diode of 2V means the worst case exposure in the LED string is 29V. A shorted diode (D2 or D6) enhances the situation by reducing the worst case voltage with respect to Neutral to 27V. An open circuit failure of the diode (D2 or D6) in this embodiment presents a shock hazard for a double fault condition if insulation is present on the electrical conductors in the system and has been compromised.

A major downside of the illustrated approach here is that TWO inductors, L3 and L1 are required, as are two independent buck switching (synchronous or asynchronous) and current control circuits, which would appear in the locations of the circles. This doubling of components takes up board area, increases packaging volume needs, increases noise emissions, and increases cost significantly. Though diodes are shown, those versed in the art can easily foresee using switches (such as transistors) in their stead.

Figure 25:
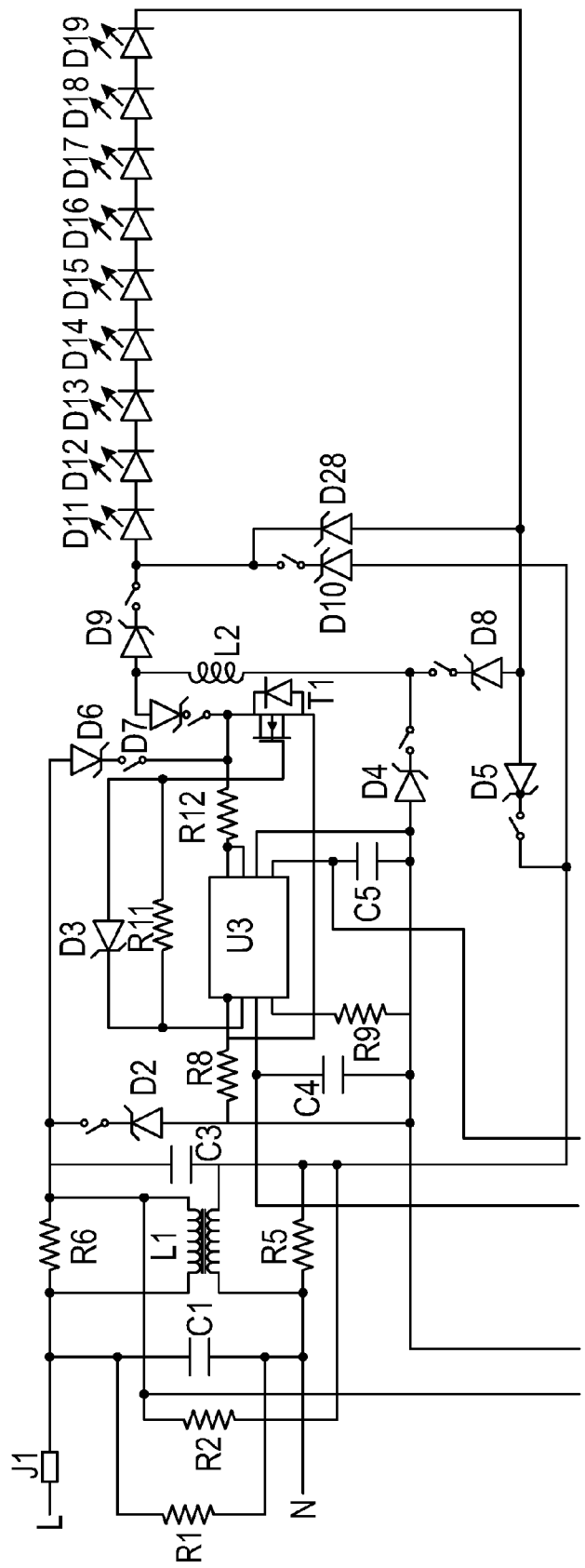
FIG. 25 is a circuit diagram of an electronic driver controller circuit for an embodiment of the LED lamp, which uses a buck converter, a believed novel neutral line connection for an LED string, and an inductor as an energy storage device.

FIG. 25 is a circuit diagram of an electronic driver circuit for an embodiment of the LED lamp, which uses a buck converter, a neutral line connection for an LED string, and an inductor as an energy storage device. Rather than duplicate components, the embodiment shown in FIG. 25 switches connectivity during the start of each AC half cycle to a core, reduced component-count, grouping.

The classical bridge rectifier, with its 4 diodes, creates a "DC" supply, by swapping Neutral and Line connections every half cycle, with the Line being a positive half sine wave voltage with respect to Neutral (earth), or, on the next AC half cycle, a negative half sine wave with respect to Neutral. Any attempt to lower the voltage in one half cycle with respect to a designated rectifier-output "ground" at the supply output is met with futility when the next half cycle switches in the alternate rectifier diode pair, bringing the full peak voltage in the opposite polarity to the output "ground" with respect to the earthed Neutral connection. This then leads to those versed in the art resorting to magnetic isolation, which allows one leg of the output to be designated as ground, the other leg to be rectified to produce a positive only output with respect to that ground. This embodiment does not use the classical bridge rectifier, as can be seen by the way any of the diodes are connected to either Line or Neutral in the figure.

Upon inspection, it can be seen that there is only one buck converter (one controller, one switch, one inductor) in FIG. 25, with this embodiment showing an asynchronous buck converter configuration. As for the previously discussed FIG. 24, the diodes and transistors in one embodiment may be replaced with devices such as switches or transistors. The Neutral line connection is connected to earth with a low impedance at some, typically singular, point in the power network to which the invention is connected. The embodiment, in FIG. 25 above, implements a buck converter, using a buck controller device, U3, a switching component device T1, an energy storage device, such as an inductor L2; and a load such as the one used in the present embodiment comprised of light emitting diodes (e.g., LEDs, represented as diodes, in one embodiment), or "load equivalent devices", in a singular or plurality of devices such as shown in the figure as devices D11-D19.

When the Line is positive with respect to Neutral (or eventually "earth"), current flows from Line through D6 (ignoring one embodiment's EMI filter that is placed between these nodes—a noise filter and its placement are not at the core of the embodiment), then splits to supply the buck controller and other "low voltage" circuits' supply currents by being connected to a device, such as a limiting resistor R12 or a blocking diode. Alternatively, this connection could have gone to a regulator or the buck controller's HV pin 8 and to switch device T1. In one embodiment, current control is desired and is sensed through R8. A switching device, such as diode D4, connects one embodiment's controller ground connection to one end of the energy storage device, in one embodiment, an inductor (L2), then through a current steering device D9, to which the positive side of the load, LEDs D11-D19, is connected. The negative side of this load's current is then steered by either D5 when the switch T1 is on, or by steering device D8 when the switch is off and current circulates from the energy storage device L2. The current flow paths for this half of the AC cycle, with switch T1 on and off, respectively, are shown in the following figures. The figures illustrate a main current path, a small current path for the controller circuit and for a damper resistor in the EMI filter implementation. It should be appreciated that the filter is not an essential part of the embodiment.

Figure 25A:
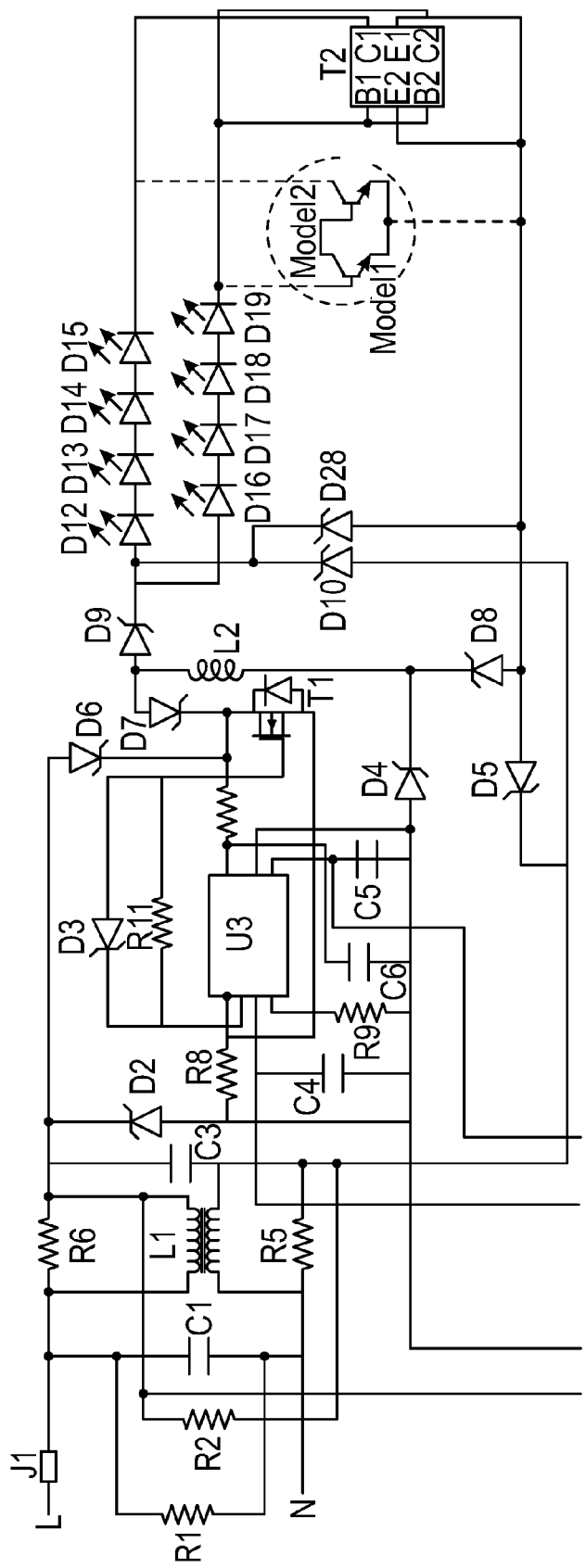
FIG. 25a is a circuit diagram of a variation of the electronic driver controller circuit of FIG. 25, with an added diode as a blocking device.

FIG. 25a is a circuit diagram of a variation of the electronic driver controller circuit of FIG. 25, with an added diode as a blocking device. Diode D11 is added as a block for the driver during bench testing. In variations, diode D11 can replace R12 in FIG. 25, or it can be put in series with R12 since the diode is a blocking device in terms of the direction of current flow allowed to the HV pin of the driver. R12 serves to limit the inrush current for the capacitor C4 and can also externalize some of the power dissipation in the linear regulator that drops the high-voltage (up to 187Vpk) to around 20V for the internal driver circuits.

In this and some other embodiments, the LEDs are not 3V LEDs, but have a forward voltage Vf of 6V (such as having two die in series in a package or using an alternative technology such as OLED (Organic LED) for the diodes). To keep voltage to a nominal 24V, the diodes are arranged in a 4-in-series group (which has eight diodes), with two groups in parallel. There is a common anode between the two groups. To ensure matched currents in each group, a current mirror is added as T2. In one simplified embodiment, T2 is a matched pair of NPN transistors configured as a current mirror. The left transistor has base and collector tied, forming the anode of a diode equivalent, with the emitter being the cathode of the diode. When current flows through that diode equivalent, a forward voltage Vf (expressed as Vce or Vcb) develops as a function of that current. Since the transistors are matched pairs, the second transistor's Vbe increases or throttles current until it has a forward voltage Vf more or less matched to the forward voltage Vf of the first transistor. Further variations, with other types of current mirrors, are readily devised or are familiar to those skilled in the art.

In another variation, eight 3V devices in series are used in either FIG. 25 or FIG. 25a (or variation thereof) as the LED arrangement. In further variations, more than two groups of LEDs can be arranged in parallel, with each group having another transistor of a current mirror in analogous arrangement to the two group current mirror of FIG. 25a. The additional current mirror transistors are connected similarly to the right transistor in T2, while the left transistor is the current reference that gets matched. Ideally, all of the transistors are matched. Because of the current mirror, the anode side of the LEDs is one more diode drop removed from neutral (about 0.7V) because of the transistor that was inserted. In these embodiments, either of the transistors or any of the diodes, including a LED, or plurality of LEDs opens that fully open the circuit, could create a single fault condition.

Figure 26:
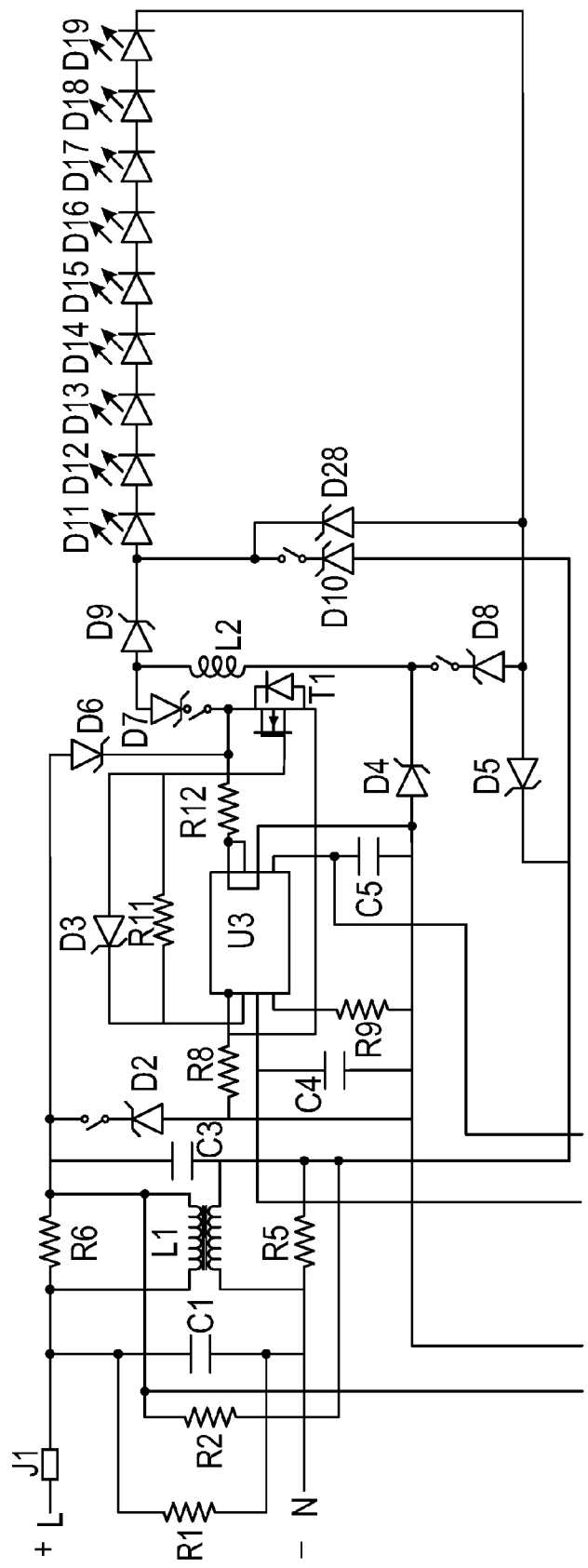
FIG. 26 shows the circuit of FIG. 25 with switch T1 on, illustrating a main current path, and a small current path for the controller circuit.

FIG. 26 shows the circuit of FIG. 25 with switch T1 on, illustrating a main current path, and a small current path for the controller circuit. When switch T1 is closed, note that the diode string is tied to Neutral via D5 and that its total string voltage cannot go above approximately, the string node voltage that is being probed/touched plus the drop across D5. The assumption is that it is the diode string and its connections that are a shock hazard risk due to a single fault in its insulation and that the rest of the circuits have a more robust insulation insulation/housing. If diode D5 fails short, the diode voltage drop goes to zero; if it or any of the LEDs, or full groupings of LEDs, in series opens, a single fault shock hazard is presented. Generally speaking, a shock hazard would only be present in the event of a double fault if possible load touchpoints are insulated and the insulation also fails. If there is not a second level of protection, such as insulation of touchpoints, a further optional method of protection is described as a feature.

Figure 27:
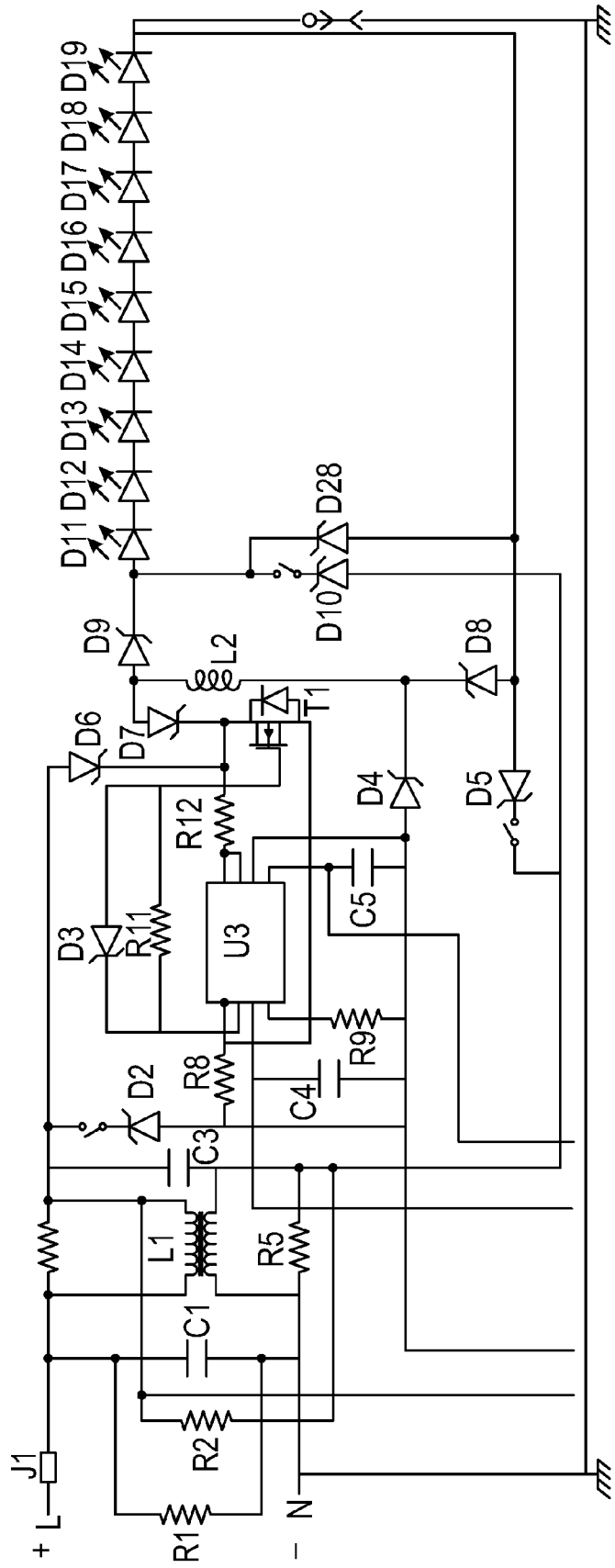
FIG. 27 shows the circuit of FIG. 25 with switch T1 off, exhibiting a comparative low shock hazard risk.

FIG. 27 shows the circuit of FIG. 25 with switch T1 off, exhibiting a comparatively low shock hazard risk. When the switch T1 is open, the energy storage device L2 supplies power to the load, D11-D19 in one embodiment. A minimalized shock hazard is present, with this current path when the switch is open. This current is limited by the current drawn by the controller, though, so is not a big concern since the controllers typically have about 2 mA or less current through them. With the device shown in the figure, a maximum current is specified as 1.2 mA.

When the Line is negative with respect to Neutral (or eventually "earth"), current flows from Neutral through steering (or "switching" or "steering"—these terms can be used interchangeably) device D10 (ignoring one embodiment's EMI filter that is placed between these nodes—a noise filter and its placement are optional to the embodiment) to the positive side of the load, LEDs D11-D19. A steering/blocking device D9 prevents a short circuit to the Line. The negative side of the load's current is blocked from Neutral by steering device D5, and is steered by device D8 to energy storage device L2, an inductor in one embodiment. Steering devices D4 and D6 block a short circuit to the Line. Steering device D9 blocks current from going into the load while switching device T1 is on and steers current from the energy storage device L2 into the load when switching device T1 is off. Steering device D7 will supply current to the buck controller throughout this half AC cycle.

The current flow paths for this half of the AC cycle, with switch T1 on and off, respectively, are shown in the following figures. A main current path, a small current path for the controller circuit and for a damper resistor in the EMI filter implementation (the filter is an optional functional block in the TCA (6)).

Figure 28:
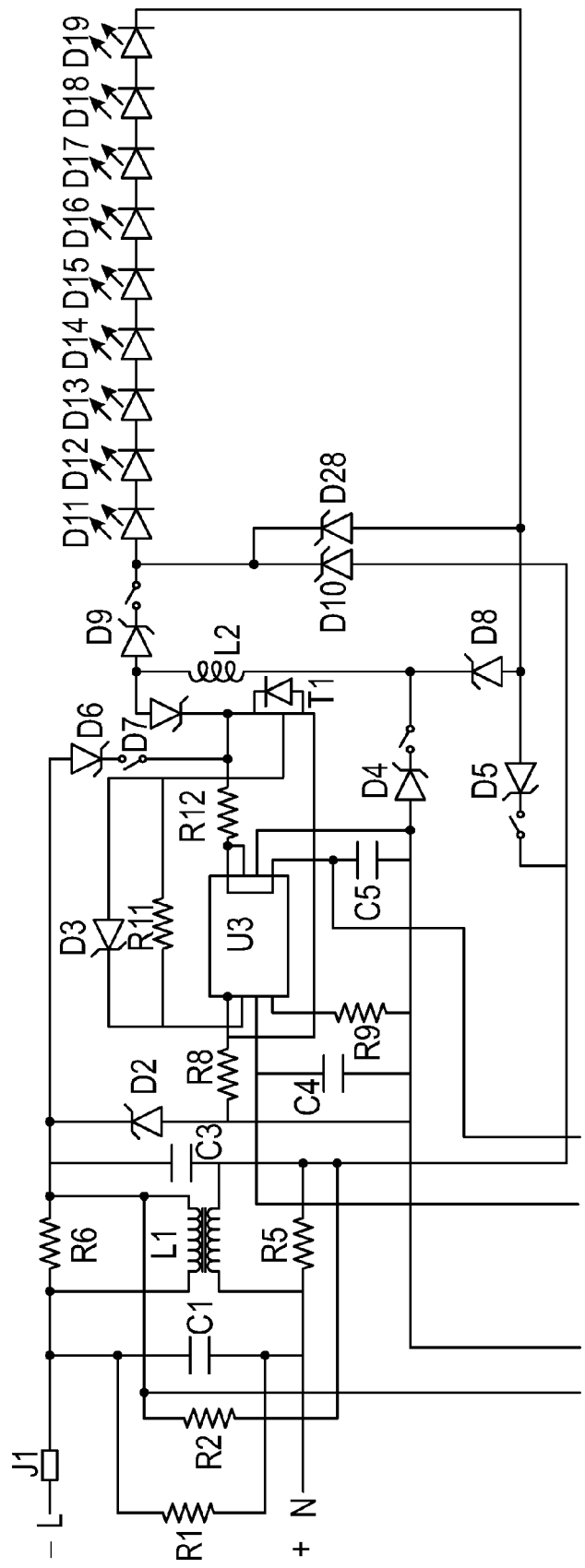
FIG. 28 shows the circuit of FIG. 25 with switch T1 on, illustrating a main current path and a small current path.

FIG. 28 shows the circuit of FIG. 25 with switch T1 on, illustrating a main current path and a small current path. When switch T1 is closed, note that the diode string is tied to Neutral via D10 and that its total string voltage cannot go below, approximately, the string node voltage that is being probed/touched, relative to the anode of D11, plus the drop across D10. The assumption is that it is the diode string and its connections that are a shock hazard risk due to a single fault in its insulation and that the rest of the driver circuits have a more robust insulation insulation/housing. If diode D10 fails short, the diode voltage drop goes to zero; if it opens, a single fault shock hazard is presented. Generally speaking, a shock hazard would only be present due to a double fault if there is an insulation failure on the load wiring/components touch points. If there is not, a further optional method of protection is described as a feature.

Figure 29:
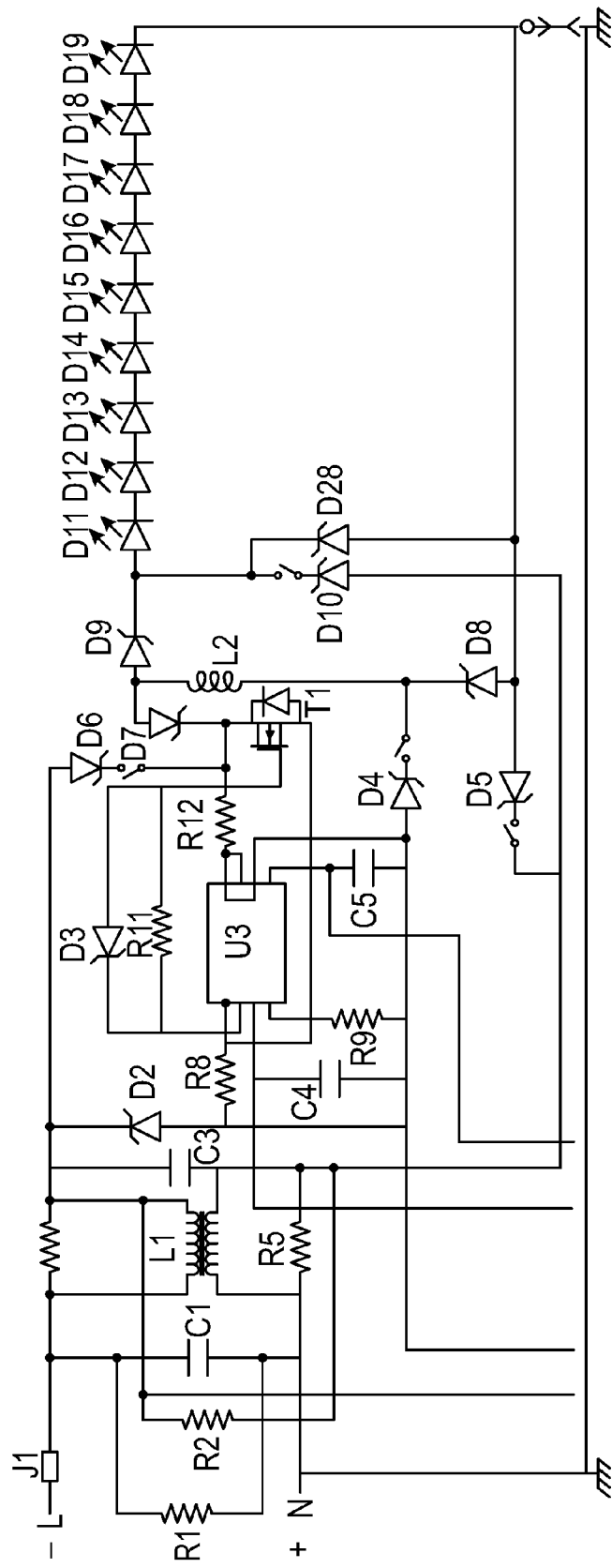
FIG. 29 shows the circuit of FIG. 25 with switch T1 off, illustrating a minimal shock hazard.

FIG. 29 shows the circuit of FIG. 25 with switch T1 off, illustrating a minimal shock hazard. When the switch T1 is open, the energy storage device L2, an inductor in one embodiment, supplies power to the load, D11-D19 in one embodiment. A minimal shock hazard is present with the current path when the switch is open. This current is limited by the current drawn by the controller, though, so is not a big concern since the controllers typically have about 2 mA or less current through them.

As previously noted, a single fault shock hazard does present itself if the steering devices D10 or D5 devices fail open circuit during the times that the switch T1 is closed. One embodiment would be to recognize that functional steering devices at D5 and D10 will have a very low voltage drop across them, for a diode, about 2V or less, for a switch (or transistor), as little as near-zero volts. Sensing a voltage drop across the D5 and D10 devices could be used to initiate protection actions such as opening switch T1, using a relay disconnect, or activating a "crowbar" across line and neutral to open a protection device, such as a fuse, permanently.

The operation of the buck controller, however, relies upon a current path between line and neutral, so opening that connection with an open D10 or D5 device will cause the controller to turn off and the switch T1 to stay open circuit as a consequence of the controller being turned off and, in an alternative embodiment, aided by a pull-down resistor between the gate and source of the switch MOSET. The circuit is, therefore, inherently double fault protected during the "on" switch cycle. In one embodiment, however, a "hold-up" capacitor C4 is used to hold Vcc of the controller on during short periods of time, possibly multiple AC cycles. The controller, however, can be, and is in one embodiment, implemented with a low voltage lockout that senses the absence of a voltage across Line/Neutral, which then turns off switch T1. The circuit in one embodiment is, again, inherently fault tolerant. The only other possible shock hazard is if control circuitry draws more than the few milliamps assumed. Here, an under voltage lockout (UVLO) that turns off switch T1 does nothing to mitigate the shock hazard. One embodiment reduces the current draw during UVLO; another embodiment fires a crowbar circuit to open the fuse on the line side during UVLO.

In another embodiment, Neutral is held as a "virtual" zero voltage level by the power supply circuit and the Line voltage is always supplied as a positive voltage with respect to neutral. Again, a bridge or other rectifier is not used. Instead, a conventional buck converter is used when the Line voltage is more positive than the Neutral line connection. This lends itself to a very efficient power supply design for that positive half cycle of the AC waveform. In many description instances in the present disclosure, it is assumed that a lower voltage than line is desired at the load or that a power factor circuit is not used. Nothing precludes the addition to, or replacement of, the buck with a boost, or any combination thereof, in any further embodiment described herein. Control functions and the load are all on a positive supply relative to Line/earth. This is shown in the following figure.

Figure 30:
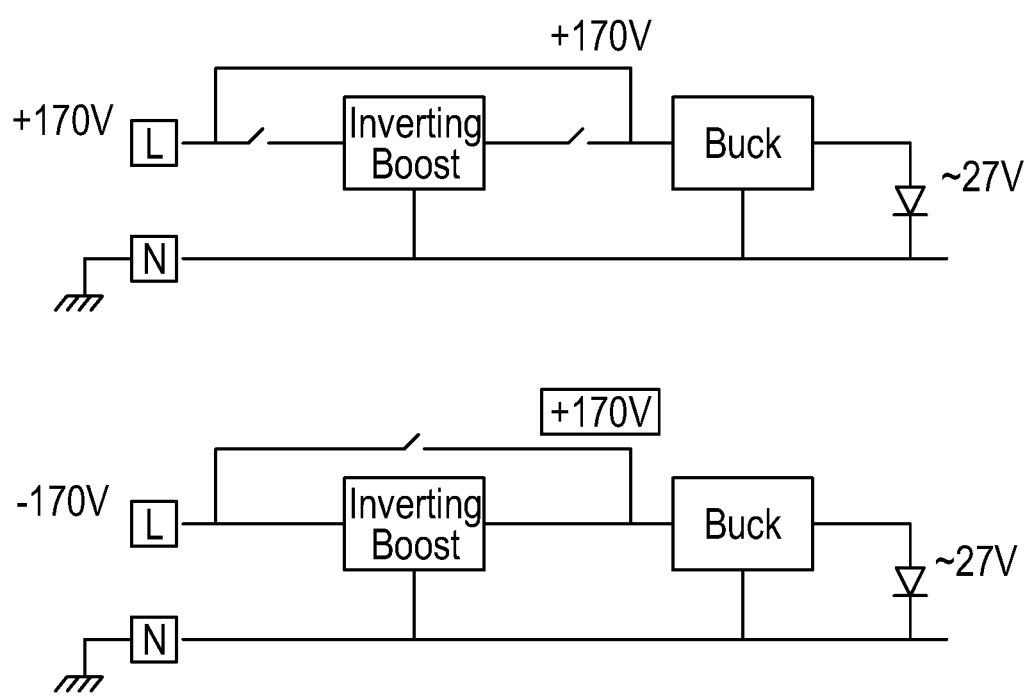
FIG. 30 is a block diagram illustrating concepts of operation of the buck converter in an electronic driver circuit for an embodiment of the LED lamp.

FIG. 30 is a block diagram illustrating concepts of operation of the buck converter in an electronic driver circuit for an embodiment of the LED lamp. Rather than swap Neutral and Line during the negative half cycle of the AC waveform, as with a bridge rectifier, the Line voltage is boosted above neutral to a positive voltage or current that can then be presented directly to the load, or to the buck converter. In one embodiment, the voltage of the boost circuit is boosted by double the Neutral to peak voltage using an inverting boost circuit. As a result, the load can always be tied directly to Neutral, with the buck converter always operating from a power input that is always positive with respect to Neutral/earth. At the peak of the AC cycle, as an example of one embodiment shown in the following figure, the Line connection is actually, and nominally, at −170V for a 120 VAC mains supply. The boost circuit applies −340V, referred to the Line side, which results in +170V with respect to Neutral. By doing so, the load can always be referenced to Neutral and, in the case of a LED string, the voltage anywhere on the string cannot be any higher with respect to earth than the LED string voltage, plus possibly a diode drop if those versed in the art decide to use one to separate sources of current to the load.

One fault that has not been mitigated is a Line/Neutral interchange wiring fault and, in many instances such as hardwired connections made by licensed experts/craftspeople, is not a concern for mitigation. With the presence of an earth connection, this type of fault is easily detected by those versed in the art, such as, for example, measuring current injected or drawn from Line to earth and Neutral to earth. In any case, failure of the mitigating means of the present embodiments and a Line/Neutral interchange is a double fault condition.

In devices such as light bulbs, an earth connection is not connected by wire. Here we can implement a "ground fault"

protection means, such as that described in the provisional patent application to which the present application claims benefit of priority. In that method, the outbound current to the LED string is measured, and then compared to the inbound current from the LED string. Any difference in current, apart from miniscule leakage currents, would indicated an alternate means of conduction is bypassing the inbound current—most likely a conductive path by flora or fauna to earth. At that point a protective means is initiated, comprising such actions as a crowbar to open the fuse, swapping line and neutral connections, or opening the connection to the LED string. Other means, such as radio frequency (RF) effects could also be used to detect line/ground swaps where, in one embodiment, the impedance of the correct Neutral to earth connection is lower than the correct Line to earth impedance, since RF impedance is relative to an earth connection. It should be appreciated that the shock mitigation mechanism may be applied to circuits other than those using LEDs including such apparatus as power supplies, motors, other forms of lighting, etc.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that the embodiments may be extended to other devices besides lamps or lighting devices. For example, the embodiments may be extended to power supplies, low voltage electric motors, or any other suitable electric apparatus.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A lamp, comprising:
    at least one light emitting diode (LED);
    an electronic circuit configured to provide power to the at least one LED
    at least one flat circuit board having mounted thereto the at least one LED and the electronic circuit; and
    within the at least one flat circuit board is disposed a heatsink to dissipate heat from the at least one LED and a plurality of circuit paths for the electronic circuit within the at least one flat circuit board.

2. The lamp of claim 1, wherein the at least one LED comprises a first LED mounted to a first face of the at least one flat circuit board, and a second LED mounted to a second face of the at least one flat circuit board.

3. The lamp of claim 1, wherein the at least one LED comprises at least two LEDs in series electrical connection, mounted to a light center of a first face of the at least one flat circuit board.

4. The lamp of claim 1, further comprising:
    a lens mounted to the at least one LED and configured to correct a light pattern of the at least one LED to a full hemisphere.

5. The lamp of claim 1, wherein the at least one flat circuit board includes one of a substrate that is an electrical insulator and a thermal insulator, and a layer with electrical conductivity and thermal conductivity or a substrate that is an electrical insulator and a thermal conductor, and a layer with electrical conductivity and thermal conductivity.

6. The lamp of claim 1, wherein the electronic circuit comprises:
   a buck converter;
   further circuitry configured to detect current during a first half of an alternating current (AC) cycle and detect current during a second half of the AC cycle; and
   the further circuitry configured to turn off power provided by the buck converter to the at least one LED based upon detecting a difference in the current between the first half and the second half of the AC cycle.

7. The lamp of claim 1, wherein:
   the at least one flat circuit board includes an electrically conductive layer, with which the at least one LED and the electronic circuit are in electrical and thermal contact; and
   wherein at least a portion of the electrically conductive layer forms at least a portion of the heatsink.

8. A lamp, comprising:
   at least one printed circuit board that has circuit traces and also functions as a heatsink;
   at least one light emitting diode (LED) mounted to a thermally conductive area of the at least one printed circuit board, wherein the thermally conductive area comprises at least a portion of an overall area of the at least one printed circuit board; and
   a driver circuit coupled to the at least one printed circuit board and coupled by the at least one printed circuit board to the at least one LED, wherein the driver circuit is configured to detect current to or from a hot or neutral mains connection or through the at least one LED.

9. The lamp of claim 8, further comprising:
   a portion of the at least one printed circuit board having a profile dimensioned for rotational insertion into a threaded socket.

10. The lamp of claim 8, further comprising:
    one of a light diffusion device optically coupled to the at least one LED or a remote phosphor device optically coupled to the at least one LED.

11. The lamp of claim 8, wherein the thermally conductive area includes a same material as circuit traces of the at least one printed circuit board and is configured to conduct heat away from the at least one LED and dissipate the heat by one of convection, conduction or radiation.

12. The lamp of claim 8, wherein:
    the at least one LED comprises a series string of LEDs; and
    one end of the series string of LEDs is connected to a neutral of the alternating current.

13. The lamp of claim 8, wherein the driver circuit is configured to shut off power to the at least one LED responsive to the detected current failing to meet a predetermined condition.

14. A lamp, comprising:
    at least one flat, printed circuit board;
    a first light emitting diode (LED) mounted to a first face of the at least one flat, printed circuit board;
    a second LED mounted to an opposed second face of the at least one flat, printed circuit board;
    an electronic circuit coupled to the at least one flat, printed circuit board and configured to provide power to the first LED and the second LED;
    the at least one flat, printed circuit board having circuit paths that couple the electronic circuit, the first LED and the second LED; and
    the at least one flat, printed circuit board configured to act as a heatsink to dissipate at least one half watt of heat from at least the first LED or the second LED, wherein the at least one flat, printed circuit board and a further flat, printed circuit board having complementary mating features dimensioned so that the at least one flat, printed circuit board and the further flat, printed circuit board are assembled to each other with the mating features engaged.

15. The lamp of claim 14, further comprising:
    a parabolic reflector, arranged with the at least one flat, printed circuit board so that the first LED and the second LED are located at a light center of the parabolic reflector.

16. The lamp of claim 14, further comprising:
    the electronic circuit including a communication port with a connector included in or mounted to the at least one flat, printed circuit board.

17. The lamp of claim 14, wherein:
    the at least one flat, printed circuit board comprises a thermally conductive area that includes an electrically conductive layer, to act as the heatsink;
    the circuit paths include the electrically conductive layer; and
    the electrically conductive layer of the thermally conductive area has thermal performance enhanced as compared to the electrically conductive layer of the circuit paths.

18. The lamp of claim 14, further comprising:
    the at least one flat, printed circuit board having a thermally conductive area, as the heatsink, in thermal contact with the first LED and the second LED; and
    the thermally conductive area acts as an integrated reflector, or filter, for light of the first LED or the second LED.

19. The lamp of claim 14, wherein all electrical connections coupling the electronic circuit, the first LED and the second LED are formed in the electronic circuit and on the at least one flat, printed circuit board, without external wires.

* * * * *